US012771097B1

(12) United States Patent
Hall et al.

(10) Patent No.: US 12,771,097 B1
(45) Date of Patent: Oct. 20, 2026

(54) SYSTEMS AND METHODS FOR PROVIDING HIGH-INDEX-CONTRAST RIDGE WAVEGUIDE LASERS

(71) Applicant: University of Notre Dame du Lac, South Bend, IN (US)

(72) Inventors: Douglas Hall, South Bend, IN (US); Di Liang, South Bend, IN (US); Jinyang Li, South Bend, IN (US)

(73) Assignee: UNIVERSITY OF NOTRE DAME DU LAC, South Bend, IN (US)

( * ) Notice: Subject to any disclaimer, the term of this patent is extended or adjusted under 35 U.S.C. 154(b) by 960 days.

(21) Appl. No.: 17/964,266

(22) Filed: Oct. 12, 2022

Related U.S. Application Data

(60) Provisional application No. 63/254,979, filed on Oct. 12, 2021.

(51) Int. Cl.
*H01S 5/34* (2006.01)
*G02B 6/122* (2006.01)
*H01S 3/063* (2006.01)
*H01S 5/22* (2006.01)

(52) U.S. Cl.
CPC .......... *H01S 5/2214* (2013.01); *G02B 6/1223* (2013.01); *H01S 3/063* (2013.01)

(58) Field of Classification Search
CPC .......... H01S 5/2214; H01S 5/063; H01S 5/34; H01S 5/22; H01S 5/2275; H01S 5/2215; H01S 5/2272; H01S 5/277; H01S 5/3408; H01S 5/3409; G02B 6/1223
See application file for complete search history.

(56) References Cited

U.S. PATENT DOCUMENTS

| | | | |
|---|---|---|---|
| 5,561,683 A | 10/1996 | Kwon | |
| 6,026,108 A | 2/2000 | Lim et al. | |
| 7,436,868 B2 | 10/2008 | Schulte et al. | |
| 2002/0021733 A1 | 2/2002 | Lee et al. | |
| 2005/0089072 A1 | 4/2005 | Wang et al. | |
| 2006/0139743 A1 | 6/2006 | Marsh et al. | |
| 2008/0267239 A1* | 10/2008 | Hall | H01S 5/22 438/38 |
| 2009/0011531 A1 | 1/2009 | Yang | |

(Continued)

FOREIGN PATENT DOCUMENTS

| | | |
|---|---|---|
| CN | 100340038 C | 9/2007 |
| GB | 2327533 A | 1/1999 |

OTHER PUBLICATIONS

H. Wenzel et al. "Fundamental-Lateral Mode Stabilized High-Power Ridge-Waveguide Lasers With a Low Beam Divergence" IEEE Photonics Technology Letters, vol. 20, No. 3, Feb. 1, 2008. pp. 214-216. (Year: 2008).*

(Continued)

*Primary Examiner* — Xinning (Tom) Niu
*Assistant Examiner* — Delma R Forde
(74) *Attorney, Agent, or Firm* — ICE MILLER LLP

(57) ABSTRACT

A system may be configured for a laser configured to emit a circularly symmetric beam. Some embodiments of this laser may include heterostructure configured via a lithography and an etching, each satisfying at least one first criterion. And the laser may include an edge-emitter configured to be deep-etched, be confined via an oxide, and perform the emission, the heterostructure having a broadness that satisfies another criterion.

19 Claims, 42 Drawing Sheets

(56) References Cited

U.S. PATENT DOCUMENTS

| | | | |
|---|---|---|---|
| 2009/0207873 | A1 | 8/2009 | Jansen |
| 2013/0209112 | A1 | 8/2013 | Witzens |
| 2019/0372309 | A1 | 12/2019 | Chen et al. |

OTHER PUBLICATIONS

B. S. Ryvkin et al. "Asymmetric, nonbroadened large optical cavity waveguide structures for high-power long-wavelength semiconductor lasers" Journal of Applied Physics 97, 123103 )2005) pp. 123103-1 through 123103-6 (Year: 2005).*

Design and Fabrication of Vertical External Cavity Surface-Emitting Lasers, by Gautham Ragunathan, University of Illinois at Urbana-Champaign, 2014, Urbana, Illinois.

Reliability of High Power/Brightness Diode Lasers Emitting from 790 nm to 980 nm, L. Bao, J. Bai, K. Price, M. DeVito, M. Grimshaw, W. Dong, X. Guan, S. Zhang, H. Zhou, K. Bruce, D. Dawson, M. Kanskar, R. Martinsen, J. Haden, nLight Corporation, Vancouver, WA 98665, USA, Proc. of SPIE vol. 8605, 86050N, 2013.

Nonselective oxidation of GaAs-based III-V compound semiconductor heterostructures for in-plane semiconductor lasers, Di Liang, Jusong Wang, Douglas C. Hall, Dept. of Electrical Engineering, Univ. of Notre Dame, Notre Dame, IN USA 46556-5637.

High Power Pure-Blue Semiconductor Lasers, Osamu Goto, Shigetaka Tomiya, Yukio Hoshina, Takayuki Tanaka, Makoto Ohta Yoshitsugu Ohizumi, Yoshifumi Yabuki, Kenji Funato, and Masao Ikeda, Development Center, Sony Shiroishi Semiconductor, Inc., https://www.researchgate.net/publication/278075014, Proceedings of SPIE—The International Society for Optical Engineering • Jan. 2007.

Cost-effective telecom/datacom semiconductor lasers, Proc. SPIE 6782, Optoelectronic Materials and Devices II, 67821J (Dec. 12, 2007); doi:10.1117/12.754558, Nong Chen, Dick T. R. Chen, Wei Hsin, Steven Bo Chen, Frank Xiong, Hernan Erlig, Paul Chen, Xian-li Yeh, David C. Scott, Axel Sherer.

Properties and Characterization of Deeply-Etched, High-Index-Contrast Ridge Waveguide Structures, Christopher S. Seibert, Graduate Program in Electrical Engineering, Notre Dame, Indiana, Apr. 2012.

High-index-contrast ridge waveguide laser with thermally oxidised etched facet and metal reflector, Christopher S. Seibert and Douglas C. Hall, Electronics Letters, Jul. 22, 2010 , vol. 46 No. 15.

Compound Semiconductor Oxidation for Single-Mode High-Index-Contrast Ridge Waveguide and Quantum Cascade Lasers, Jinyang Li, Graduate Program in Electrical Engineering, Notre Dame, Indiana, Dec. 2020.

Combination of Low-Index Quantum Barrier and Super Large Optical Cavity Designs for Ultranarrow Vertical Far-Fields From High-Power Broad-Area Lasers; Agnieszka Pietrzak, Paul Crump, Hans Wenzel, Gotz Erbert, Frank Bugge, and Gunter Trankle, IEEE Journal of Selected Topics in Quantum Electronics, vol. 17, No. 6, Nov./Dec. 2011.

* cited by examiner

DOUBLE TRENCH PROCESS FLOW FOR GaAs-BASED LASER HETEROSTRUCTURE

1- Cleave samples to size, keep the samples in the $N_2$ dry box whenever they are not in process. Record the crystal orientation for straight laser!

2- Rinse in running DI water for at least 10 seconds

3- Solvent Clean a. >1 min ACE b. >1 min IPA

4- Refresh etch a. 1:4 $HCl:H_2O$ for 5 sec

5- $SiN_x$ deposition (PECVD)

a. Recipe SiNxB for 15 min, ~ 3000 Å (thicker if needed, need witness sample to confirm the thickness for further process)

i. $SiH_4/NH_3$ 40/4 sccm ii. Pressure=500 mT iii. Power=200W iv. Rate~200 Å/min 6- Spin on photoresist (Shipley 1813)

a. Spin on HMDS- 30 sec @ 4000 rpm (2000 rpm/sec ramp) 2 drops b. Spin on 1813- 30 sec @ 4000 rpm (2000 rpm/sec ramp) 3~4 drops c. Prebake - 60 sec @ 90 °C

FIG. 35A

7- Pattern Exposure (Autostep)
   a. Pattern exposure
      i. ~0.2 sec exp (~100 mJ)
      ii. 25 sec AZ917 (one time developing is very important!)
8- $O_2$ Descum (PVA)
   a. 30 seconds without cage
      i. 60 sccm $O_2$
      ii. Pressure=300 mT
      iii. Power=600 W
9- Etch $SiN_x$ (Oxford ICP)
   a. $O_2$ clean and season chamber
   b. jl_sinx recipe
      i. $CF_4$:$O_2$ 25:5 sccm
      ii. Pressure=90mT
      iii. Power= 40W (typical DC bias ~62V)
   c. Etch rate ~2400 Å/min
10- PVA then PR remover 1165, then solvent clean (fresh solvent, long time!)
11- Mount sample to carrier wafer
   a. Thin coat of Shipley 1813 PR applied to back of sample with swab
   b. Place sample on center of 4" Si carrier wafer
   c. Hard bake: 120 °C, 10 min
12- Etch substrate (ICP-RIE)

FIG. 35B a. $O_2$ clean and season chamber
   b. Recipe: JL_BCA
      i. $BCl_3/Cl_2$ 10/2.5 sccm
      ii. Pressure=5 mT
   c. Power: RF1=40 W, RF2=500 W (typical DC bias~146 V)
   d. Temperature=20°C
   e. Etch rate ~600 Å/min
   f. Target depth ~2.3 µm (~ 4 min)

13- Solvent Clean

14- Spin on photoresist (SPR220-7) 3~4 drops of PR!
   a. Spin on HMDS- 30 sec @ 4000 rpm (2000 rpm/sec ramp)
   b. Spin on SPR220-7 - 30 sec @ 4000 rpm (2000 rpm/sec ramp)
   c. Postbake- 120 sec @ 115 °C 15- Ridge protection exposure (Autostep)
   a. Pattern exposure
      i. ~0.8 sec exposure (~500 mJ)
      ii. ~280 sec in AZ327 (until clear)

16- $O_2$ Descum (PVA)
   a. Same conditions as Step 8

17- Etch $SiN_x$
   a. Same conditions as Step 9

18- PVA then put in PR remover 1165 (long time), then solvent clean

FIG. 35C 19- (Optional) GaAs cap layer removal (ICP-RIE)

a. Same condition as Step 11 and 12 b. 100 seconds ~0.9 µm, total etching depth ~3.2 µm

20- Refresh etch

21- Oxidation (III-V furnace) *example conditions given* a. Time: 40 min b. Temp: 420°C c. $O_2$ content: 0.5% (5000 ppm)

22- Etch $SiN_x$ – follow by the metal deposition as soon as possible!

a. Same conditions as Step 9

*Isolation lithography step can be added here if devices are to be bar tested.*

23- SEM cross section, check oxidation result before proceed!

24- Refresh etch 25- p-side metal deposition (Oerlikon evaporator)

a. Mount sample on 45° angle stage (angle perpendicular to ridges)

b. 150 Å Ti @ 1 Å /sec c. 1000 Å Au @ 2Å/sec d. Turn around sample 180° on angle stage and repeat deposition

*Lift off if isolation lithography step added.*

26- Lapping and Polishing (Allied MultiPrep system)

a. Mount sample onto polishing platen i. Heat platen to ~135°C

FIG. 35D ii. Apply clear wax to platen iii. Gently place sample face down into wax iv. Place platen on mounting press and gently apply pressure v. Check and record initial wafer thickness b. 9μm paper down to ~125 μm thick i.150 RPM, CCW, full load ii.check the thickness and uniformity frequently c. 3μm slurry on Green pad – to complete mirror shine (~110 μm thick)

i. 200 RPM, CW, full load ii. Continue until all scratches removed from sample backside d. 1μm slurry on new green pad – 15 min i. 200 RPM, CW, full load e. Final thickness ~ 100 μm 27- Wax removal in acetone a. Soak in acetone until sample is free of wax, typically 10-12 hours 28- Refresh etch 29- N-side metal deposition (Oerlikon evaporator)

a. $Au_{0.88}Ge_{0.12}$, ~360 Å i. 1 small pellet, AuGe on thermal boat ii. Remote recipe, Rate ~ 2 Å/s (~110-120 A current, ~31% power)

b. Ni, ~60 Å i. Remote recipe, Rate ~ 1 Å/s (~7.1% power)

FIG. 35E i. Rate ~ 2 Å/s

30- Metal Anneal (Allwin RTP)

a. 7 seconds at 410 °C

31- Cleave laser bars i. Al thickness 20 mil iii. Place sample face up on Al strip with edge perpendicular to intended facets running parallel to Al strip edge b. Scratch samples where cleave is desired with diamond scribe c. Bend samples around metal cylinder 32- Release laser bars from Al strip a. Trichloroethylene (TCE) – 30 min or until wax is completely dissolved b. Fresh TCE- 5 min c. Acetone- 5 min d. IPA- 5 min e. Drain off remaining IPA, use IPA squirt bottle to rinse bars out of beaker onto a cleanroom wipe.

f. Carefully remove bars from wipe

33- Cleave bars into individual laser die (if necessary)

a. Use dicing saw or repeat steps 29 and 30, cleaving at 500 μm intervals b. Handle individual die using vacuum pen

FIG. 35F

SYSTEMS AND METHODS FOR PROVIDING HIGH-INDEX-CONTRAST RIDGE WAVEGUIDE LASERS

CROSS-REFERENCE TO RELATED APPLICATIONS

This application claims the benefit of U.S. Provisional Application No. 63/254,979 filed on Oct. 12, 2021 and entitled "High-Index-Contrast Ridge Waveguide Lasers," the content of which is incorporated by reference herein in its entirety. This application is further related to U.S. Publication No. 2008/0267239 filed on Apr. 18, 2008 and entitled "High-Index-Contrast Waveguide," the content of which is incorporated by reference herein in its entirety.

STATEMENT REGARDING FEDERALLY SPONSORED RESEARCH

This invention was made with government support under grants ECCS1408456 and ECCS0925919 awarded by the National Science Foundation. The government has certain rights in the invention.

BACKGROUND

High-density photonic integrated circuits may require a high index contrast (HIC) waveguide (WG) structure. An index contrast thereof may be the difference between a core layer index of refraction and a cladding layer index of refraction. HIC WG structures are typically not achieved with a smooth cladding layer/core layer interface, e.g., with roughness thereof causing ridge-type WGs (RWGs) to have substantial scattering losses. Roughness may be measured by atomic force microscopy measurements and confirmed by transmission electron microscope imaging and correlated to effective medium approximation layer thicknesses used in modeling.

HIC RWG structures may be fabricated by a self-aligned, deep etch plus non-selective wet oxidation process. Oxidation smoothing techniques employing wet oxidation have produced silicon-on insulator (SOI) WGs exhibiting significant reductions in propagation losses. However, success with group III-V compound semiconductors, such as aluminum gallium arsenide (AlGaAs) and/or GaAs, is challenging.

Edge-emitting laser diodes notoriously have an asymmetric near-field optical mode, resulting in an elliptical far-field radiation pattern. And poor in-plane current and optical confinement limit diode-laser spatial mode quality and stability. Vertical cavity surface emitting lasers are known to produce symmetric beams, but with much lower output power relative to edge-emitting devices.

Very large mode slab-coupled optical WG laser (SCOWL) devices are known, but they are deficient at least in terms of quality of the optical beam and operating power requirements. Graded index separate confinement heterostructures (GRINSCHs) are also known, e.g., being designed (i) to broaden the WG mode to reduce the power density at the facet (e.g., via a large optical cavity (LOC)) and (ii) for high-power applications (e.g., diode pump solid state lasers) where beam quality is not significant. And even broader LOC WGs are known as super LOCs (SLOCs). But the WG may not be made wider, e.g., without additional WG modes turning on, causing a deterioration of the quality of the output beam. A single mode WG may have a cut-off width, and the WG width may need to be below the cut-off width for it to be single mode.

There is thus a need to provide a laser with a lower oxide-confined active core width, while yielding a substantially symmetric output beam.

SUMMARY

Systems and methods are disclosed for providing a circular beam oxide-confined HIC RWG edge-emitting light amplification by stimulated emission of radiation (laser). Accordingly, one or more aspects of the present disclosure relate to a laser configured to emit a circularly symmetric beam. At least one embodiment of this laser may include a heterostructure configured via lithography and etching, the lithography satisfying at least one first lithography criterion and the etching satisfying at least one first etching criterion. The laser according at least one embodiment may include an edge-emitter configured to be deep-etched, to be confined via an oxide, and to emit a circularly symmetric beam, with the heterostructure having a broadness that satisfies a broadness criterion.

In an aspect of at least one embodiment of a laser according to the present disclosure, satisfaction of the lithography's at least one first lithography criterion indicates an optimization via a mask being caused to have a predetermined roughness, and the mask defines a ridge for the deep-etching. In an aspect of at least one embodiment of a laser according to the present disclosure, the ridge has an extent substantially about 3.25 μm, and the oxide has a thickness between 0.2 μm and 0.5 μm.

In an aspect of at least one embodiment of a laser according to the present disclosure, the deep-etching extends through a core layer of a wave guide (WG). In an aspect of at least one embodiment of a laser according to the present disclosure, the deep-etching further extends into a quantum well.

In an aspect of at least one embodiment of a laser according to the present disclosure, satisfaction of the etching's at least one first etching criterion indicates at least one sidewall of the oxide as having a roughness, the roughness satisfying at least one roughness criterion.

In an aspect of at least one embodiment of a laser according to the present disclosure, the heterostructure is further configured to optimize oxidation by including a predetermined ratio of oxygen and water vapor such that the oxide is grown.

In an aspect of at least one embodiment of a laser according to the present disclosure, the beam is made symmetric via the confinement of a horizontal WG on at least one sidewall having a set of dimensions substantially similar to another set of dimensions of a vertical WG built into the heterostructure.

In an aspect of at least one embodiment of a laser according to the present disclosure, the laser comprises a high-index-contrast (HIC) ridge WG (RWG). In an aspect of at least one embodiment of a laser according to the present disclosure, an emission wavelength is between 0.63 μm and 1.5 μm. In an aspect of at least one embodiment of a laser according to the present disclosure, the HIC RWG implements a single-spatial-mode. In an aspect of at least one embodiment of a laser according to the present disclosure, the heterostructure comprises an aluminum gallium arsenide (AlGaAs) lattice. In an aspect of at least one embodiment of a laser according to the present disclosure, an output of the laser is stable at least 165 milliwatts (mW), the stability being achieved via the implementation maintaining the single-spatial-mode, when the laser is driven to a higher output power.

In an aspect of at least one embodiment of a laser according to the present disclosure, the edge-emitter is integrated in a planar photonic integrated circuit (PIC).

In an aspect of at least one embodiment of a laser according to the present disclosure, the heterostructure comprises a graded index separate confinement heterostructure (GRINSCH). In an aspect of at least one embodiment of a laser according to the present disclosure, the GRINSCH is grown via metalorganic chemical vapor deposition (MOCVD), and the GRINSCH comprises a substantially large asymmetric optical cavity having a single offset quantum well (QW) favoring fundamental mode oscillation.

In an aspect of at least one embodiment of a laser according to the present disclosure, the beam is characterized by a circular mode that is substantially about 1.9 μm $1/e^2$, and the beam is further characterized by an angle indicating circular symmetry that is substantially about 30 degrees full-width at half-maximum (FWHM).

In an aspect of at least one embodiment of a laser according to the present disclosure, the beam is characterized by a beam quality factor ($M^2$) that is substantially about 1.2, and the laser has a substantially low astigmatism, indicating an ability for the beam to be simultaneously focused in a plurality of axes.

The present disclosure includes disclosure of methods for providing a laser. In at least one embodiment of the present disclosure, such a method comprises providing a heterostructure configured via a lithography and an etching, wherein the lithography satisfies at least one first lithography criterion and the etching satisfies at least one first etching criterion; and deep-etching an edge-emitter configured to be confined, via an oxide, and to emit a circularly symmetric beam, wherein the heterostructure has a broadness that satisfies a broadness criterion. In an aspect of at least one embodiment of a method according to the present disclosure, the satisfaction of the lithography's at least one first lithography criterion indicates an optimization via a mask being caused to have a predetermined smoothness, and the mask defines a ridge for the deep-etching.

Implementations of any of the described techniques and architectures may include a method or process, an apparatus, a device, a machine, a system, or processor-executable instructions stored on a computer-readable storage device.

BRIEF DESCRIPTION OF THE DRAWINGS

The details of particular implementations are set forth in the accompanying drawings and description below. Like reference numerals may refer to like elements throughout the specification. Other features will be apparent from the following description, including the drawings and claims. The drawings, though, are for the purposes of illustration and description only and are not intended as a definition of the limits of the disclosure.

FIGS. 35A-35F provide a listing of steps for a double trench process for a GaAs-based laser heterostructure, in accordance with one or more embodiments.

DETAILED DESCRIPTION

Figure 1:
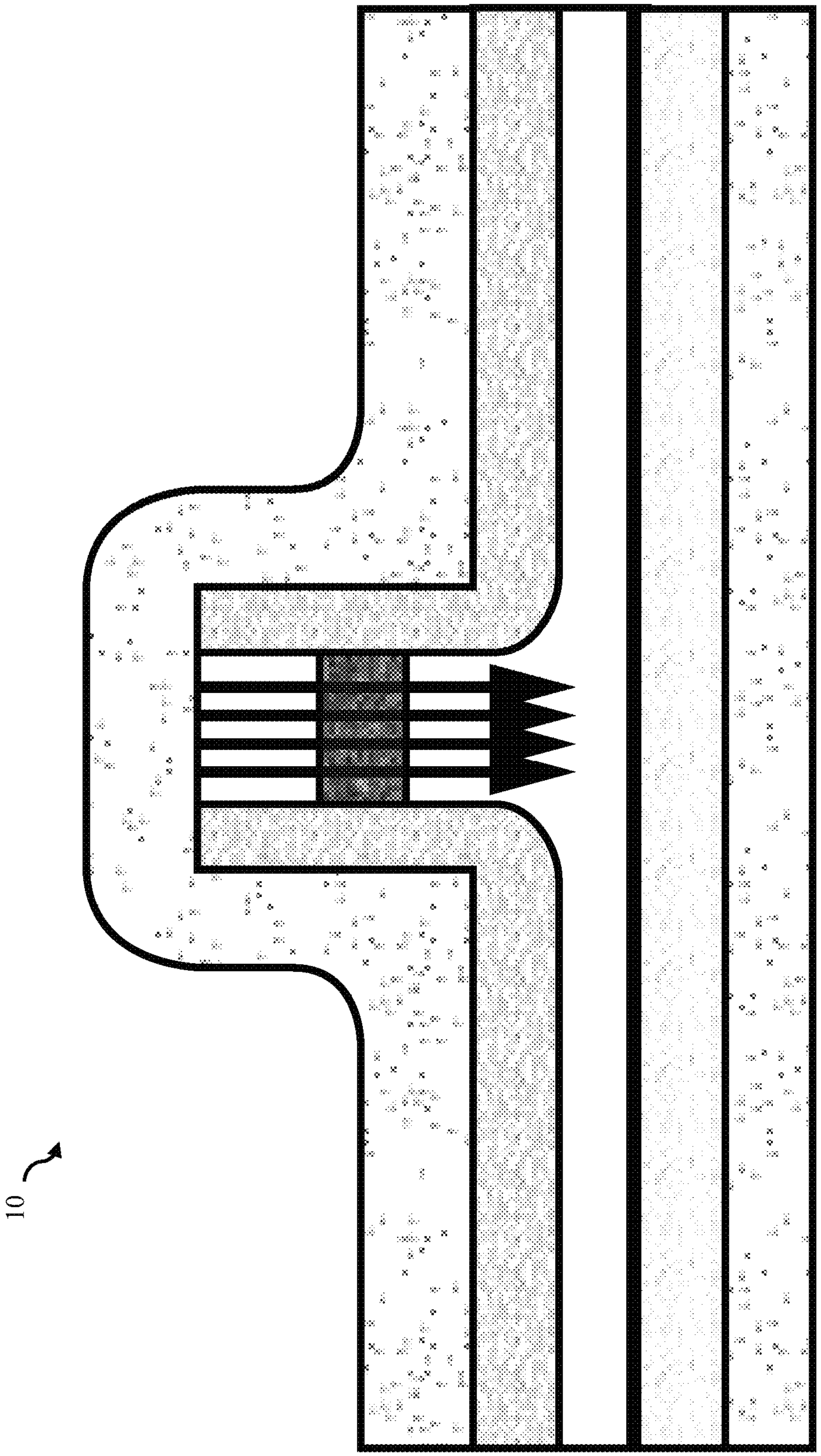
FIGS. 1-2 illustrate examples of a circular beam oxide-confined HIC RWG edge-emitting lasers, in accordance with one or more embodiments.
Figure 2:
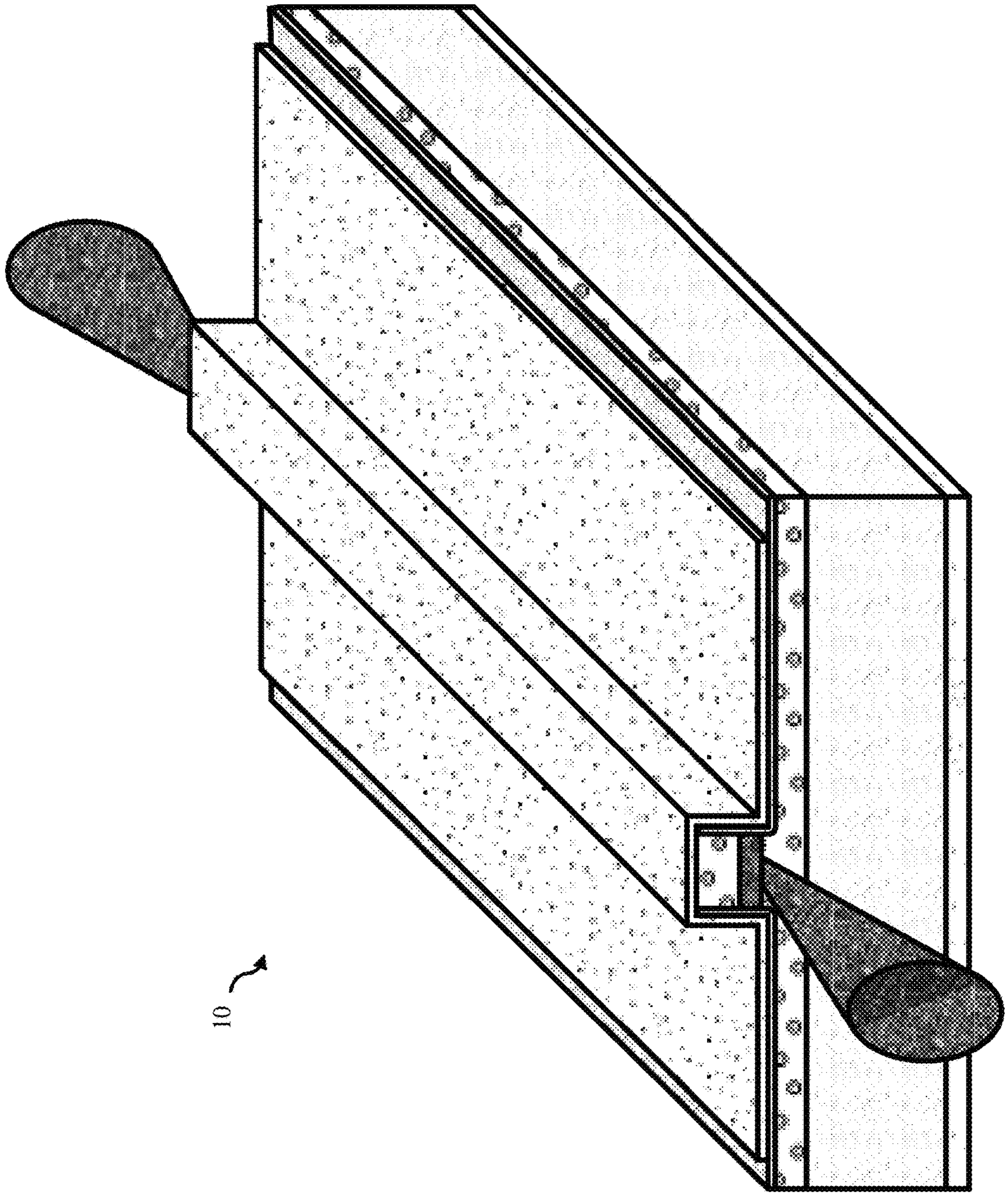

As used throughout this application, the word "may" is used in a permissive sense (i.e., meaning having the potential to), rather than the mandatory sense (i.e., meaning must). The words "include," "including," and "includes" and the like mean including, but not limited to. As used herein, the singular form of "a," "an," and "the" include plural references unless the context clearly dictates otherwise. As employed herein, the term "number" shall mean one or an integer greater than one (i.e., a plurality).

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

These drawings may not be drawn to scale and may not precisely reflect structure or performance characteristics of any given embodiment, and should not be interpreted as defining or limiting the range of values or properties encompassed by example embodiments.

The following references are used in the present description:

TABLE 1

| | |
|---|---|
| $1/e^2$ NF width | near field width at $1/e^2$ (about 13.53%) points of Gaussian fit relative to maximum |
| 2D | two-dimensional |
| 3D | three-dimensional |
| AlGaAs | Aluminum Gallium Arsenide |
| a.u. | arbitrary units |
| BPM | beam propagation method |
| CW | continue-wave |
| ° | degrees |
| DQE | differential quantum efficiency |
| EBL | e-beam lithography |
| FP | Fabry-Perot |
| FWHM | full width at half maximum |
| Γ | optical confinement factor |
| GRINSCH | graded index separate confinement heterostructure |
| HIC | high (refractive) index contrast |
| λ | lasing wavelength |
| laser | light amplification by stimulated emission of radiation |
| LiDAR | laser imaging, detection, and ranging |
| LOC | large optical cavity |
| μm | micrometers |
| $M^2$ | beam propagation ratio (beam quality factor) |
| mA | milliamps |
| mm | millimeters |
| mW | milliwatts |
| MMI | multi-mode interferometer |
| Δn | WG (core-cladding) refractive index contrast |
| n | refractive index |
| N | Nitrogen |
| NF | near field |
| nm | nanometers |
| O | Oxygen |
| PECVD | plasma-enhanced chemical vapor deposition |
| PIC | photonic integrated circuit |
| ppm | parts per million |
| QW | quantum well |
| QWH | quantum well heterostructure |
| R | oxidation rate |
| RIE | reactive ion etching |
| RMS | root mean squared |
| RWG | ridge waveguide |
| SCCM | standard cubic centimeters per minute |
| SCOWL | slab-coupled optical WG laser |
| SEM | scanning electron microscope |
| $\sigma_s$ | RMS roughness level |

TABLE 1-continued

| | |
|---|---|
| SLOC | super-large optical cavity |
| SLM | standard liters per minute |
| SOI | silicon-on insulator |
| SQW | single quantum well |
| θ | divergence angle |
| TEM | transmission electron microscopy |
| VASE | variable-angle spectroscopic ellipsometry |
| VCSEL | vertical-cavity surface-emitting laser |
| W | WG width |
| W/A | Watts per Amperes |
| WG | Waveguide |

Presently disclosed are ways of providing a deep-etched oxide-confined HIC RWG edge-emitter laser. For example, an 870 nm AlGaAs HIC RWG laser may provide a stable, single-spatial-mode output, having a total power of more than 165 milliwatts (mW). In this or another example, ridges may be provided, having an extent of 3.25 micrometers (μm), and a sidewall-smoothing oxide, having a thickness (e.g., on each side of the etched sidewall ridge) of between 0.25-0.5 μm, which may yield a substantially perfect 1.9 μm $1/e^2$ circular mode and circularly symmetric output beam. The sidewall-smoothing oxide may also form the lateral waveguide cladding layer and may be of sufficient thickness for the waveguide external electric field to be attenuated effectively to near zero, e.g., to prevent absorption loss by the contact metal deposited over the oxide. The sidewall-smoothing oxide may also form an electrically insulating layer and may be of sufficient thickness to prevent current leakage, e.g., from the p-side metal through the oxide to the n-doped semiconductor below. This beam may be characterized as substantially 30° full width at half maximum (FWHM) and with beam propagation/quality ratio/factor ($M^2$) being substantially about 1.2.

In some embodiments, strong optical confinement of contemplated HIC structures may enable substantially sharp bending of on-chip WGs (e.g., with substantially negligible bend loss). Via such contemplated structures, an overall size of integrated photonic devices may be reduced. Exemplifying a challenge in the field of HIC RWG structures, as WG index contrast increases, single mode cutoff width (w) decreases. And, as WG width w decreases and as a sidewall roughness level ($\sigma_s$) remains the same or increases, scattering loss substantially increases, exhibiting an inversely proportional relationship to the fourth power ($\propto 1/w^4$). Disclosed embodiments thus improve processing, but the heterostructure may be manufactured to be larger vertically (e.g., without having to be manufactured as narrow to generate the circular beam). In this or another example, the WG core width may be substantially about 2.0 μm, and the oxide may have an extent of 0.2-0.5 μm on each side (e.g., having a total ridge width of about 2.4 μm, when taken together).

In some embodiments, a contemplated compound semiconductor, which may be an alloy containing elements from groups III and V in the periodic table, may enable oxidation smoothing of AlGaAs heterostructures. For example, sidewall interface roughness may be lowered, and low-loss deep-etched oxide-confined HIC RWG lasers may be enabled, including curved WG devices. Deep-etched HIC RWG lasers that have a substantially narrow width (e.g., 4-5 μm mask width) are known to be predominantly (and often deficiently) operated as multi-mode. That is, it is very challenging to achieve an oxide-confined single spatial mode HIC RWG device.

Figure 11:
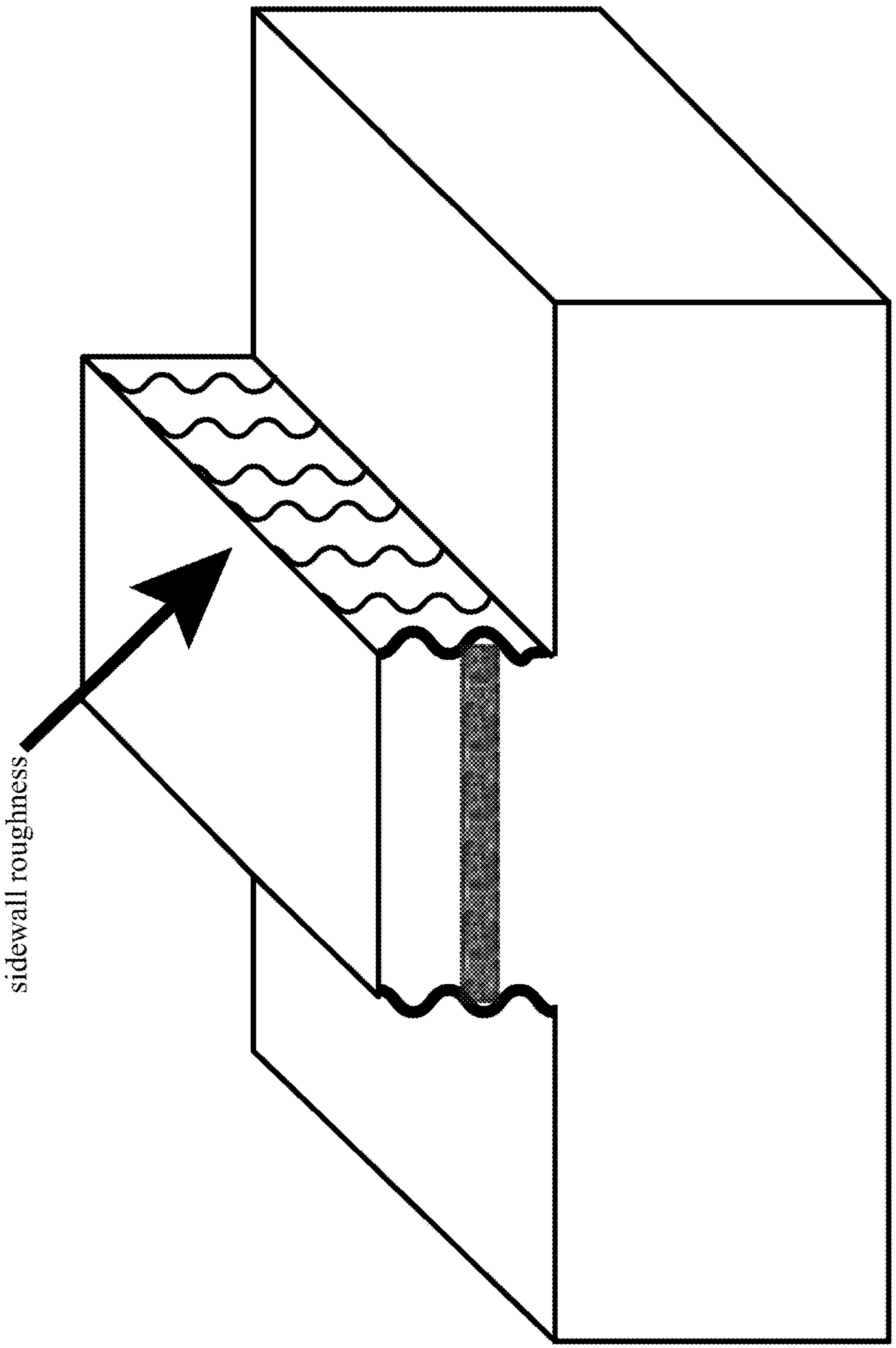
FIG. 11 (Prior Art)
FIGS. 11-13 depict ridge WG oxidation smoothing, in accordance with the prior art.
Figure 12:
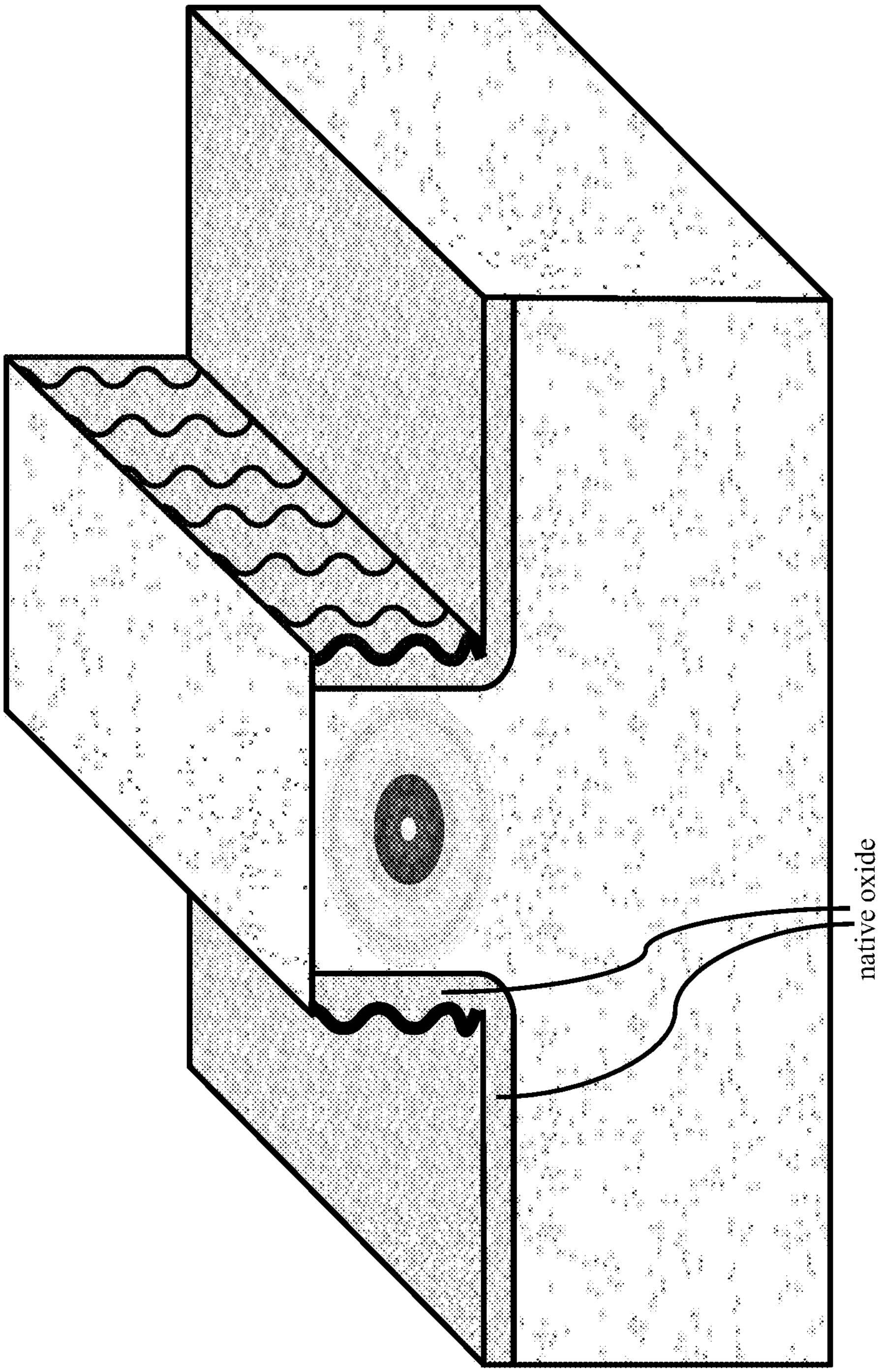
FIG. 12 (Prior Art)
Figure 13:
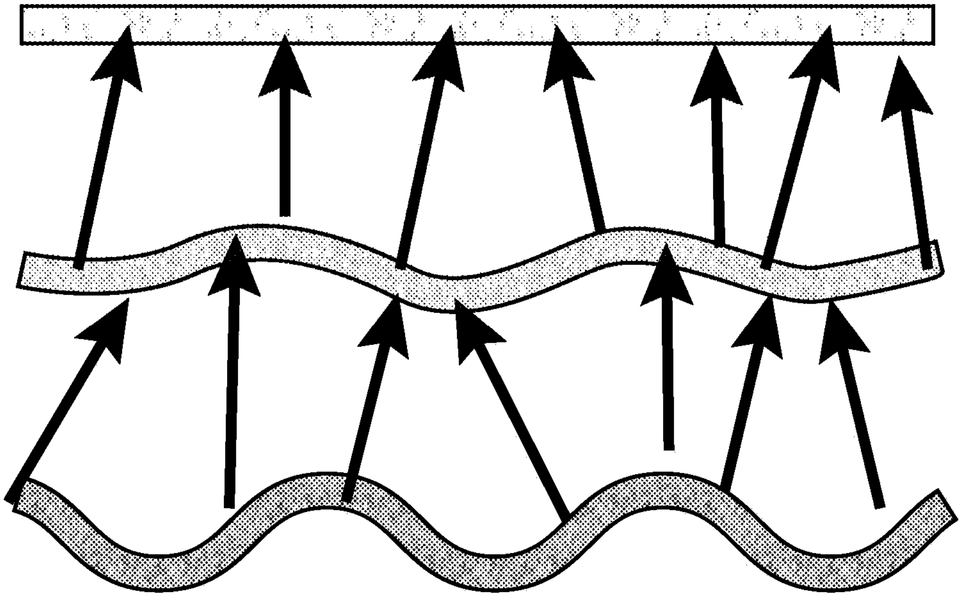
FIG. 13 (Prior Art)

FIGS. 11-13 depict an example of ridge WG oxidation smoothing. Shallow isotropic nonselective oxidation may, e.g., cause a smoothing of roughness and may reduce loss. For example, there may be caused a 104 reduction in propagation loss (1 cm WG), e.g., with a being about 0.6 to 2.2 $cm^{-1}$. FIGS. 35A-35F provide contemplated example criteria in steps of a double trench flow for a GaAs-based laser heterostructure, including cleaning, lithography, mounting, and semiconductor ridge waveguide etching. For example, lithography may be achieved by optical projection with 5× mask reduction or e-beam lithography, with a photolithographic resist (e.g., patterned atop a silicon nitride etch mask that is about 300 nm thick). In this or another example, the pattern may be developed and transferred to the silicon nitride etch mask, e.g., via inductively coupled plasma reactive ion etching (ICP-RIE) in CF4:O2. The semiconductor ridge may be etched using ICP-RIE in BCl3:Cl2 to a depth of about 2.3 microns. One or more other criteria, which contemplated embodiments may satisfy, are related to lithographic mask line edge roughness and/or to etched sidewall roughness. Waveguide propagation loss may be indirectly impacted. For example, sufficiently low HIC RWG sidewall roughness may be achieved such that the laser fundamental mode has a resulting round trip gain less than the round trip propagation loss (a criterion for achieving laser oscillation). Losses may be improved upon by herein-disclosed process improvements because the narrow waveguide lasers may reach lasing oscillation.

Figure 9:
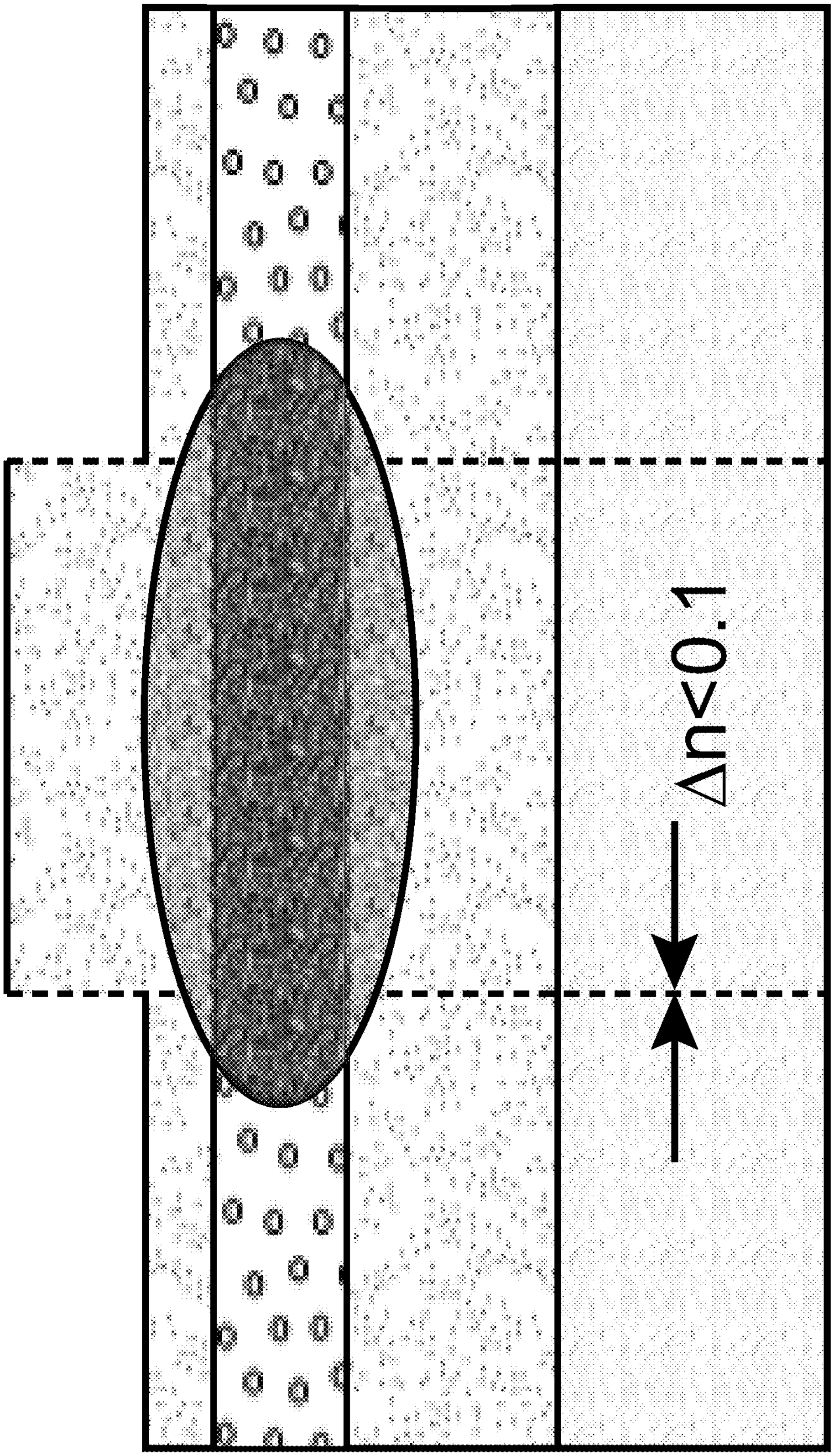
FIG. 9 (Prior Art)
FIG. 9 illustrates an example of a low index contrast WG, in accordance with the prior art.
Figure 10:
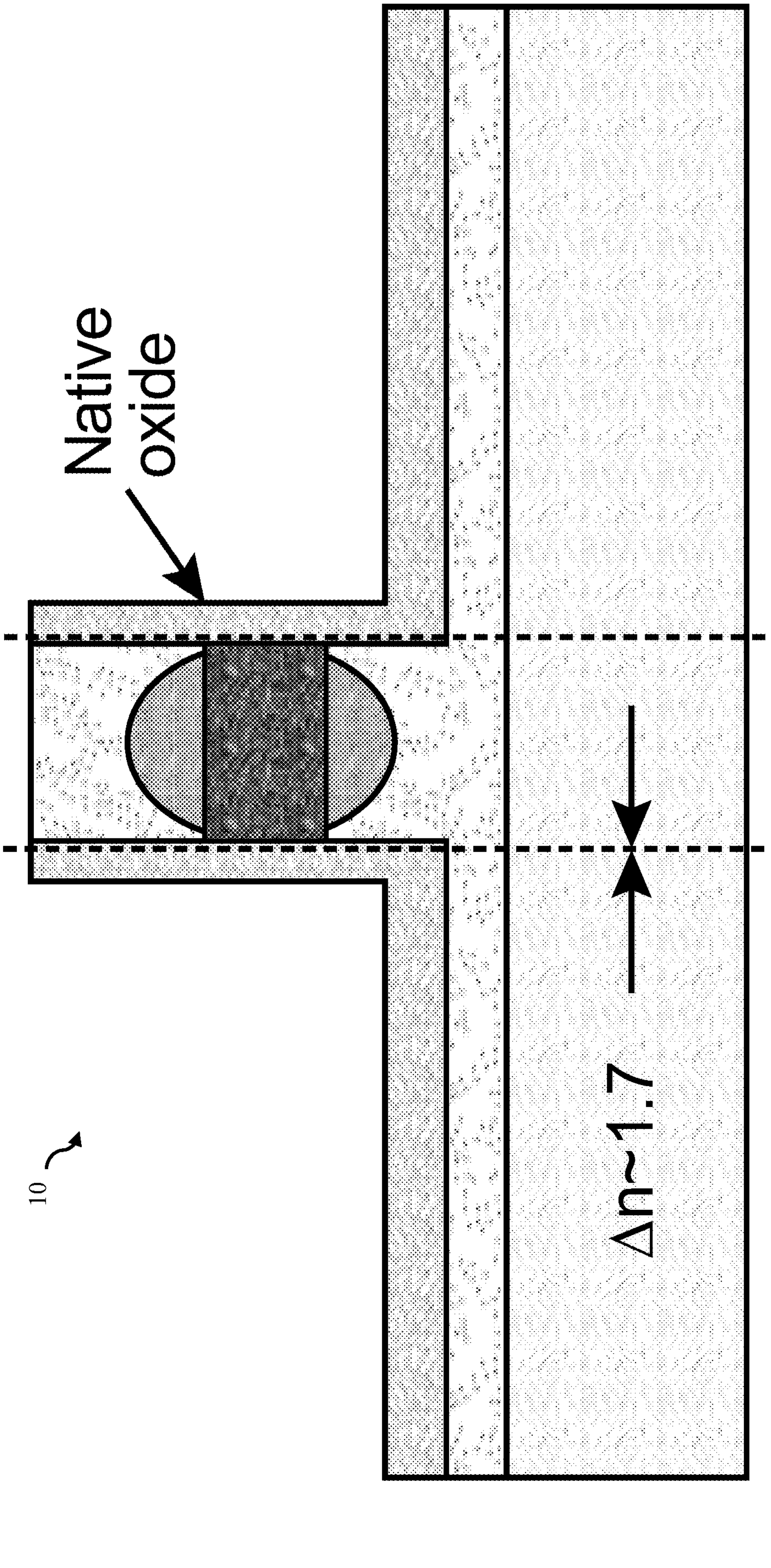
FIG. 10 illustrates an example of an HIC WG, in accordance with one or more embodiments.

In some embodiments, the WG index contrast (Δn) may be defined as $n_{core}-n_{cladding}>1$. An example of an HIC RWG structure having a low index contrast is depicted in FIG. 9. In this example, the minimum bending radii may have an extent of several millimeters (mm). And an example of HIC RWG structure 10 having a high index contrast is depicted in FIG. 10. In this latter example, the minimum bending radii may have an extent of several μm, being orders of magnitude less.

Figure 14:
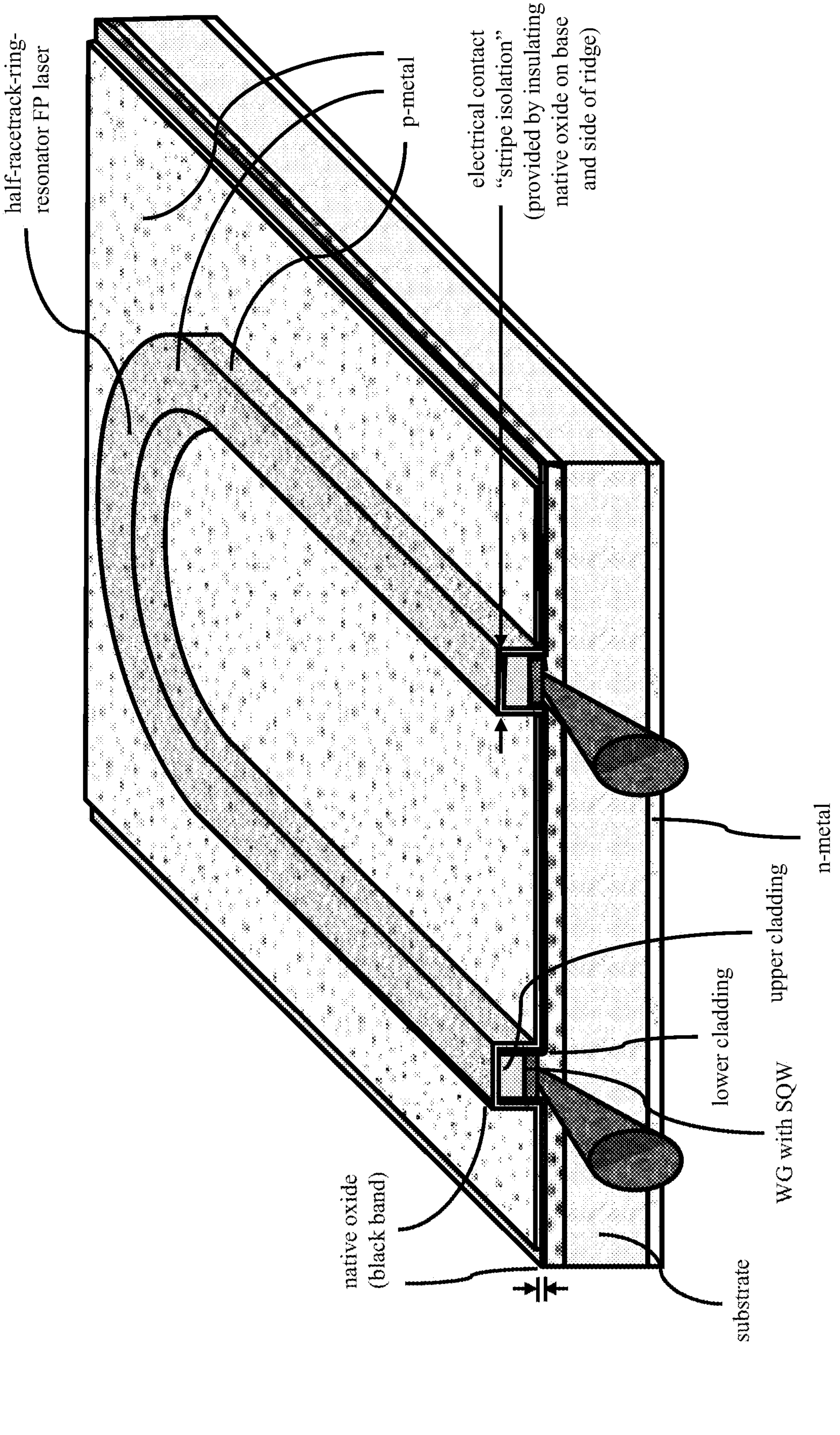
FIG. 14 (Prior Art)
FIGS. 14-16 illustrate an example of HIC RWG device applications, in accordance with the prior art.
Figure 15:
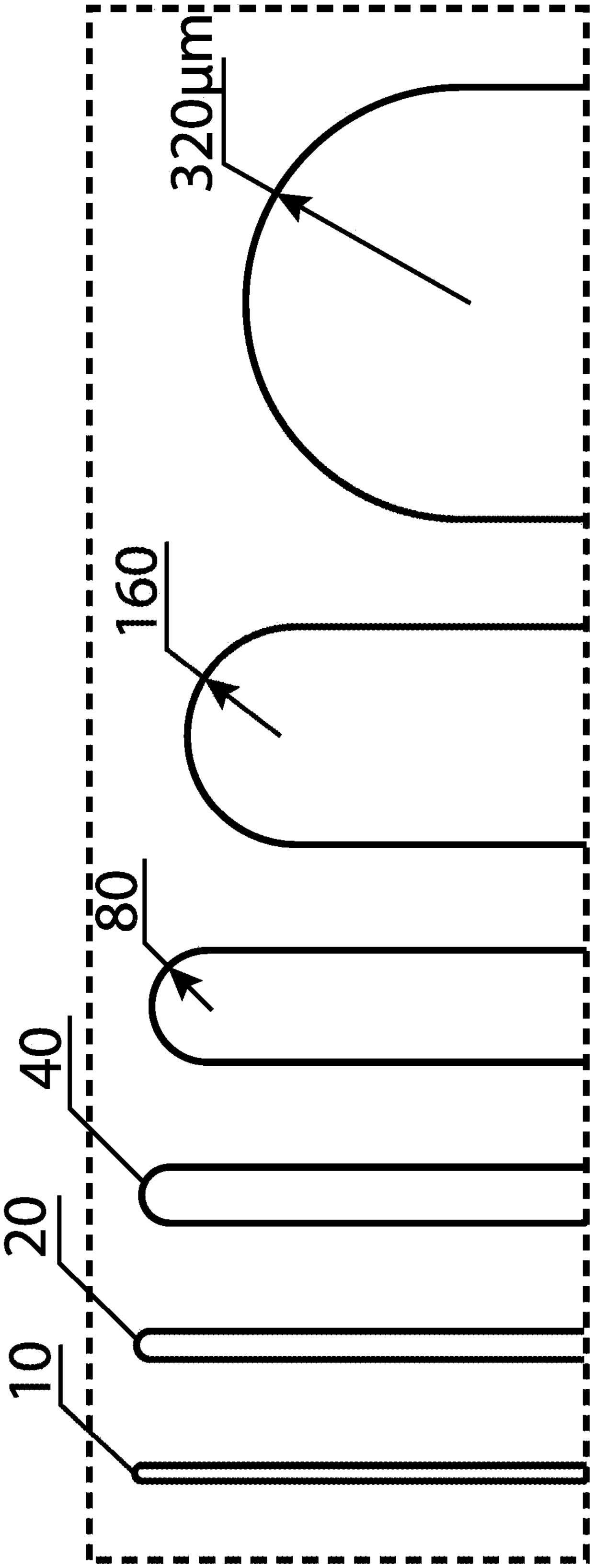
FIG. 15 (Prior Art)
Figure 16:
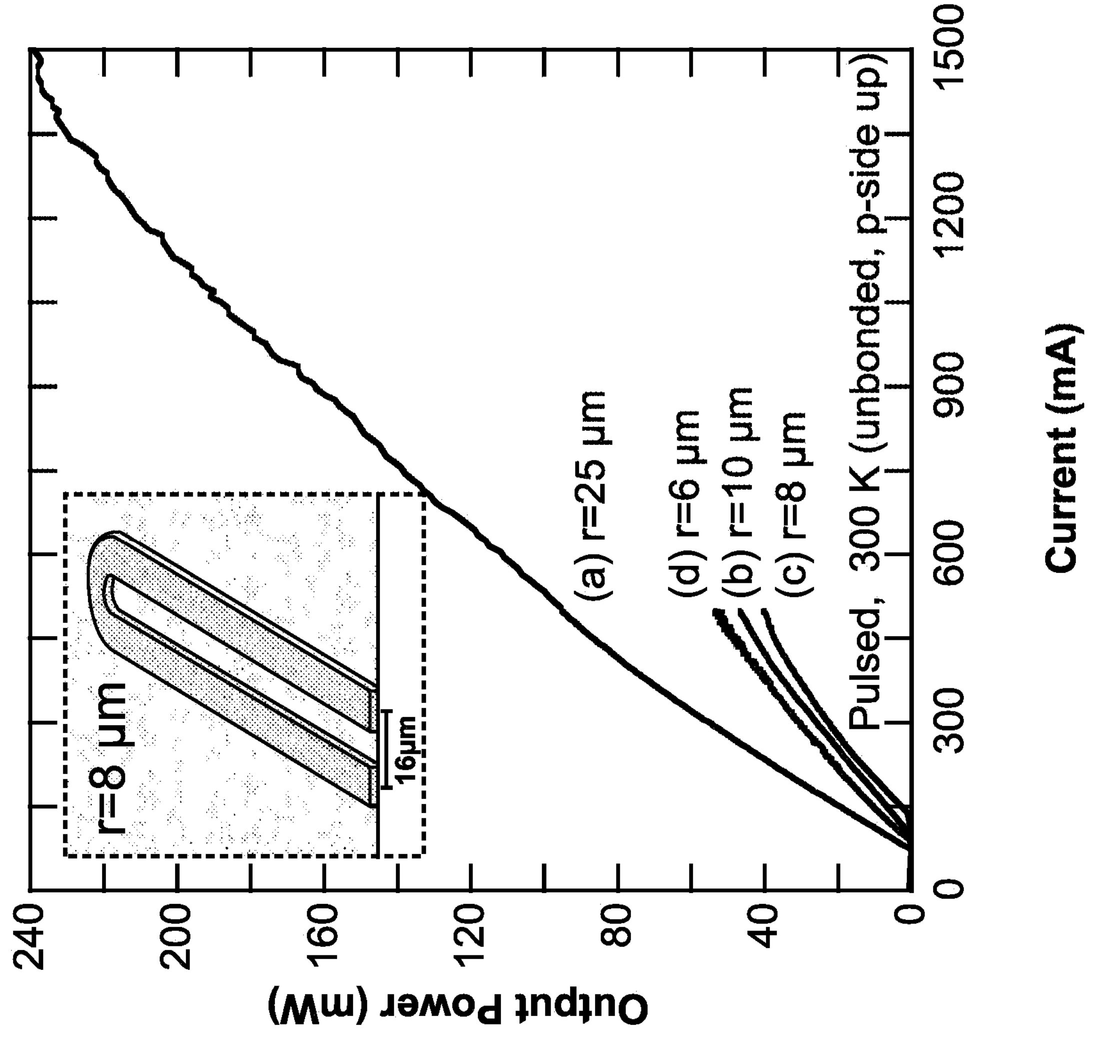
FIG. 16 (Prior Art)

FIGS. 14-16 depict an example of HIC RWG device applications. More particularly, depicted therein are half-racetrack-ring-resonator ($R^3$) lasers. Half-racetrack-ring-resonator FP lasers of varying bend radii are depicted in the examples of FIG. 15. Different examples (a)-(d) are plotted in FIG. 16, with r being 25 μm, 10 μm, 8 μm, and 6 μm, respectively. The pulsed laser beam for these may be 300 K (unbonded, p-side up).

Figure 17A:
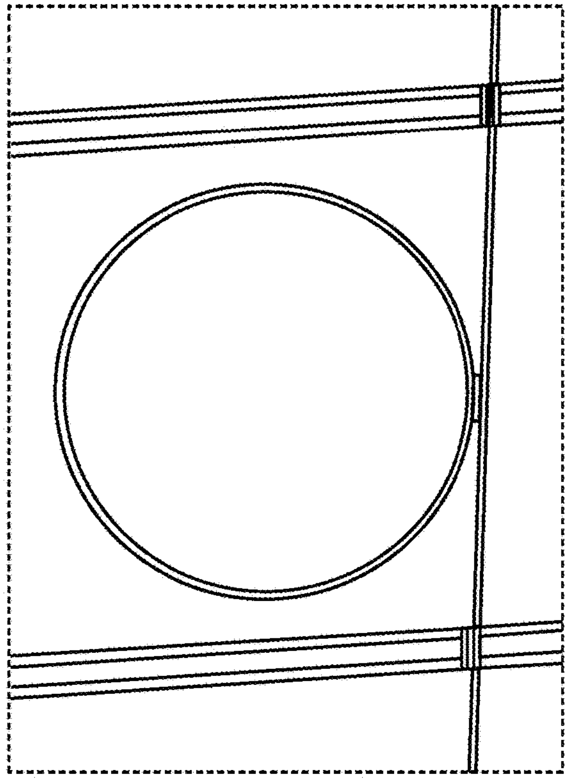
FIG. 17A (Prior Art)
FIGS. 17A-17C illustrate other examples of HIC RWG device applications, in accordance with the prior art.
Figure 17B:
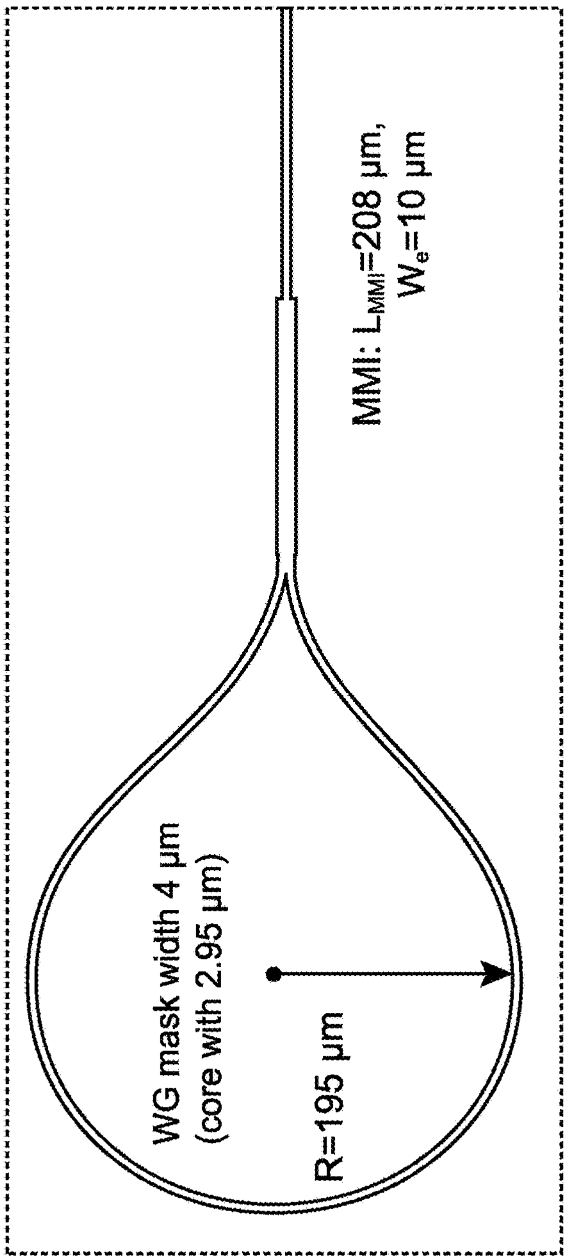
FIG. 17B (Prior Art)
Figure 17C:
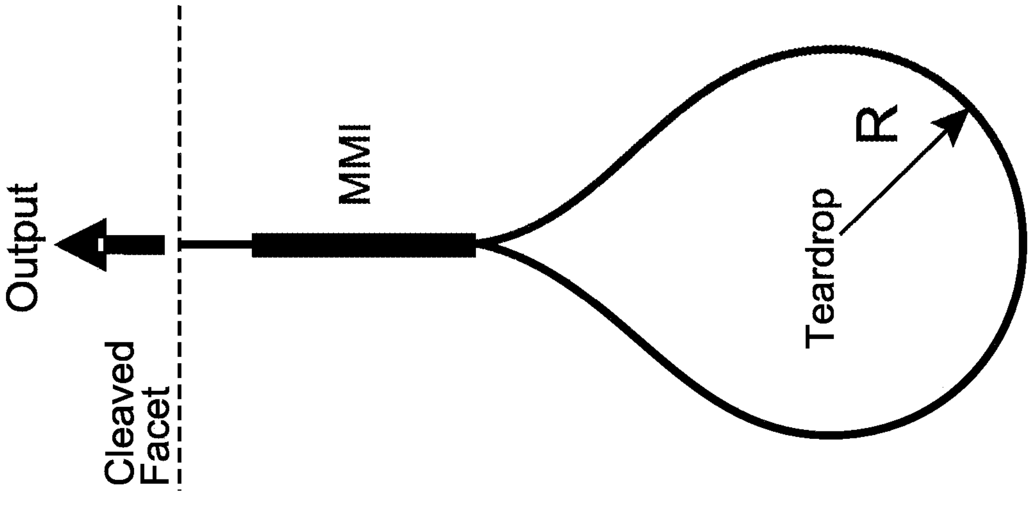
FIG. 17C (Prior Art)

In some embodiments, HIC RWG laser 10 may be stable, single-spatial-mode, high-power, and/or oxide-confined, and this laser may be provided via enhanced optimization of its lithography, etching, oxidation, and/or heterostructure design. For example, the herein-disclosed approach may provide wider SLOC WGs and/or enable manufacturing of oxygen-enhanced wet thermal oxidation and AlGaAs/GaAs heterostructure designs, e.g., for single spatial mode lasers. In this or another example, near field characteristics may be exhibited of stable, single-spatial-mode HIC RWG lasers. In these or other examples, circularly symmetric output beam HIC RWG edge emitting laser 10 may be realized (e.g., for photonic integration, by bending or curving the WG with low bend loss). For example, full ring lasers (e.g., R=150 μm) are contemplated, as shown in the example of FIG. 17A. In this or another example, teardrop geometry lasers are contemplated, as shown in the example of FIGS. 17B-17C, having R be equal to 195 μm, a multi-mode interferometer (MMI) with $L_{MMI}$=208 μm and/or $W_e$=10 μm, and a WG mask width of 4 μm (and a core width of 2.95 μm).

Mixture is in practice specified by $O_2/N_2$ ratio where $N_2$ is flow through $H_2O$ bubbler as $H_2O$ flow is not directly controlled. For example, our optimal 2500 ppm $O_2/N_2$ ratio corresponds to a calculated $O_2/H_2O$ ratio of $2500\times10^{-6}\times$ 0.675 standard liters per minute (SLM)/2.6 SLM=649 ppm. Including $N_2$ carrier gas, the $O_2/O_2+H_2O+N_2$=0.00169 SLM/(0.00169 SLM+2.6 SLM+0.675 SLM)=0.00169 SLM/3.2767 SLM=$5.515\times10^{-4}$=515 ppm of total process gas.

Figure 25:
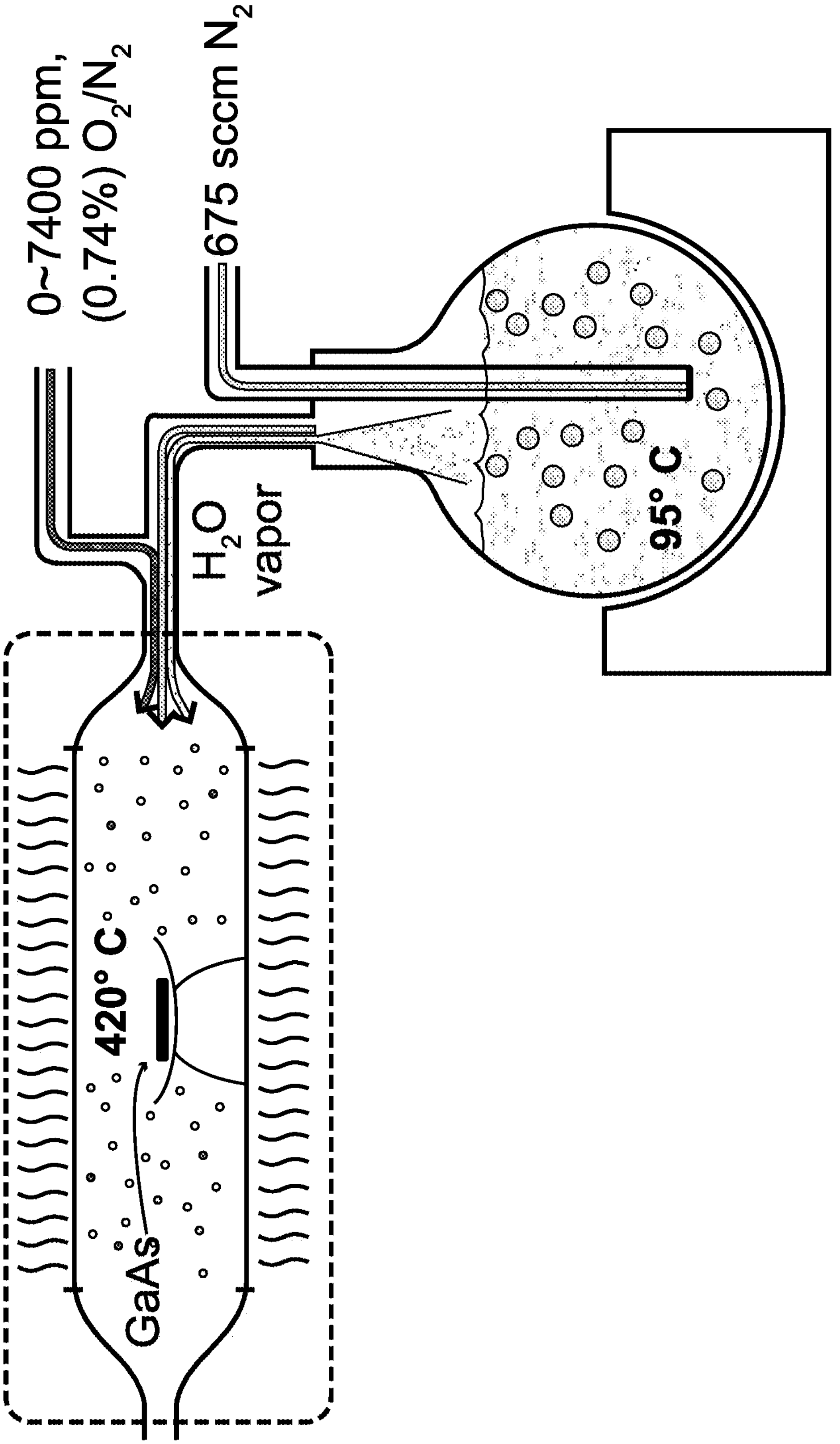
FIG. 25 (Prior Art)

In some embodiments, the disclosed heterostructure may be broader than known means. Used lithography may be optimized to produce a smoother mask that defines the ridge to be etched. And known etching is improved to produce smoother (i.e., less roughness) sidewalls or line-edges. The oxidation conditions are optimized, e.g., by adding an improved mixture or ratio of oxygen with water vapor to be able to grow that oxide. The 2.6 SLM water vapor flow rate is obtained with an $H_2O$ bubbler temperature via electronic control at 95.0° C., as shown in FIG. 25, with in-flowing bubbler carrier gas of ultra-high purity (UHP) $N_2$ at 675 standard cubic centimeters per minute (sccm). In other words, the stripe width may be patterned to produce a smoother mask edge, the etching may be optimized to produce smoother side walls, and the oxidation process may be optimized to produce a smoother oxide semiconductor interface (e.g., after growing the oxide).

In some embodiments, contemplated oxidization processes may optimize roughness at a GaAs oxide layer and/or at an interface between that GaAs oxide and the semiconductor. In these or other embodiments, the oxidation quality may be optimized at those surface grown films, e.g., with conditions being improved for growing the oxides on the sidewall of the deep-etched WGs.

In some embodiments, contemplated etching processes may remove the oxide, e.g., using buffered hydrochloric acid. For example, atomic force microscopy (AFM) may be used at a lower interface, with this lower surface between where the oxide was and the semiconductor being of interest. The GaAs oxide/interface roughness may also be obtained by fitting of variable-angle spectroscopic ellipsometry (VASE) data or by transmission electron microscopy (TEM) imaging. In some implementations there may be a minima at the interface, the surface being smoothest at a particular oxygen content. For example, rather than 4,000 or 7,000 ppm $O_2$ being added, that addition may be lowered to about 2,000 ppm $O_2$.

Figure 30:
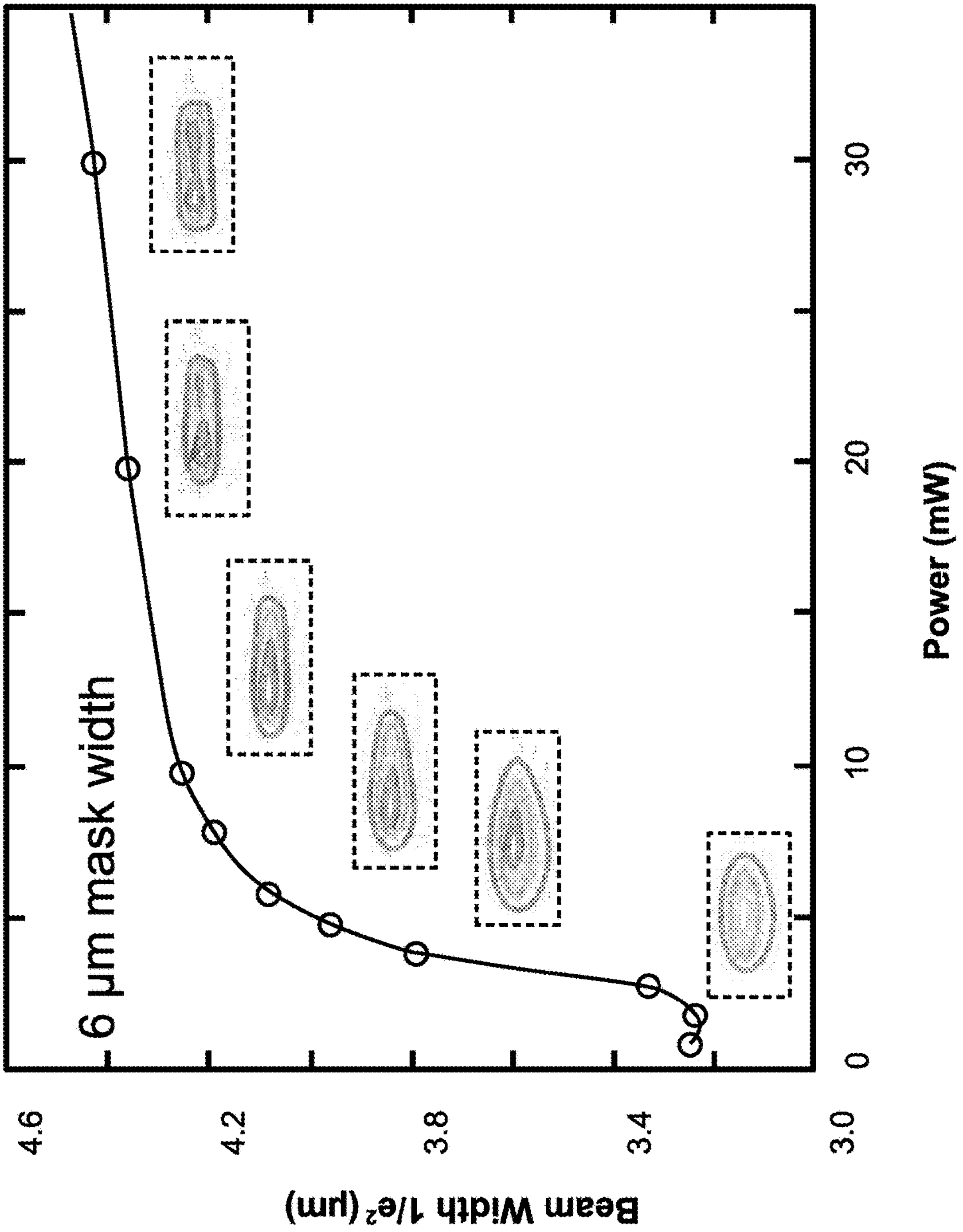
FIG. 30 illustrates an example of single- to multi-mode transition, in accordance with one or more embodiments.
Figure 31A:
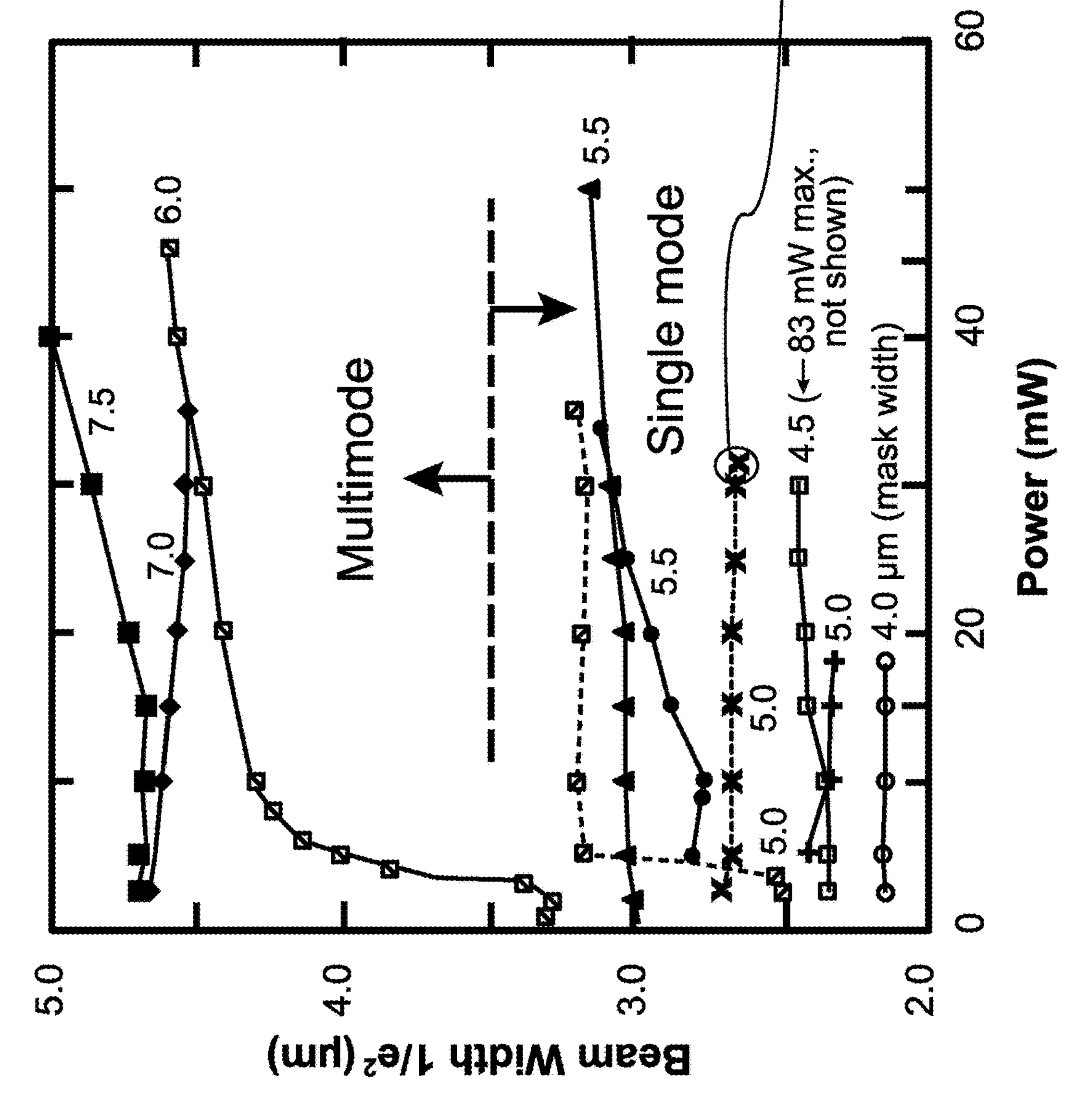
FIGS. 31A-31C illustrate exemplary plots of NF single mode stability versus power, in accordance with one or more embodiments.
Figure 31B:
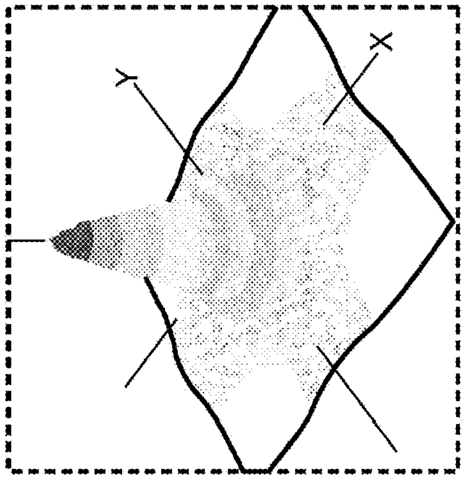
Figure 31C:
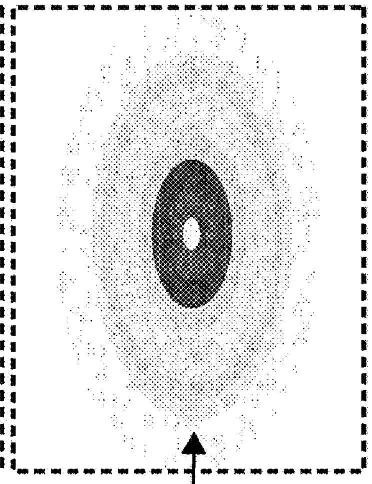

In some embodiments, being stable, the disclosed optical mode may remain single-spatial-mode, e.g., even when the laser is driven up to higher output powers. FIG. 30 depicts an example of a single-to-multimode transition, as an example of poor mode stability by not remaining in the single-mode shape while driving to higher output powers. The example of FIG. 31A, by contrast, depicts lasers having substantially the same beam size when driven to higher powers. For at least the device having a mask of 5.0 μm width (e.g., at 31.6 mW and with an $M^2$ that is about 1.2), the curve is depicted in FIG. 31A to be flat when driven harder. As such, a good, strong optical confinement is produced. When manufacturing a narrower mask width device (e.g., 3.25 μm), the circular mode ones may require more current to be run at the higher powers (here current may be limited by test equipment to about 200 mA). NF single mode stability is thus shown to relate to power in FIG. 31A, with FIGS. 31B-31C further depicting different exemplary performance parameters involving projection lithography HIC RWG edge-emitting straight WG lasers. For example, for mask widths about 4.0-5.5 μm, a stable single spatial mode may be achieved. In this or another example, a NanoScan 2 second(s) mode may be employed for profiling pulsed laser beams.

Figure 7:
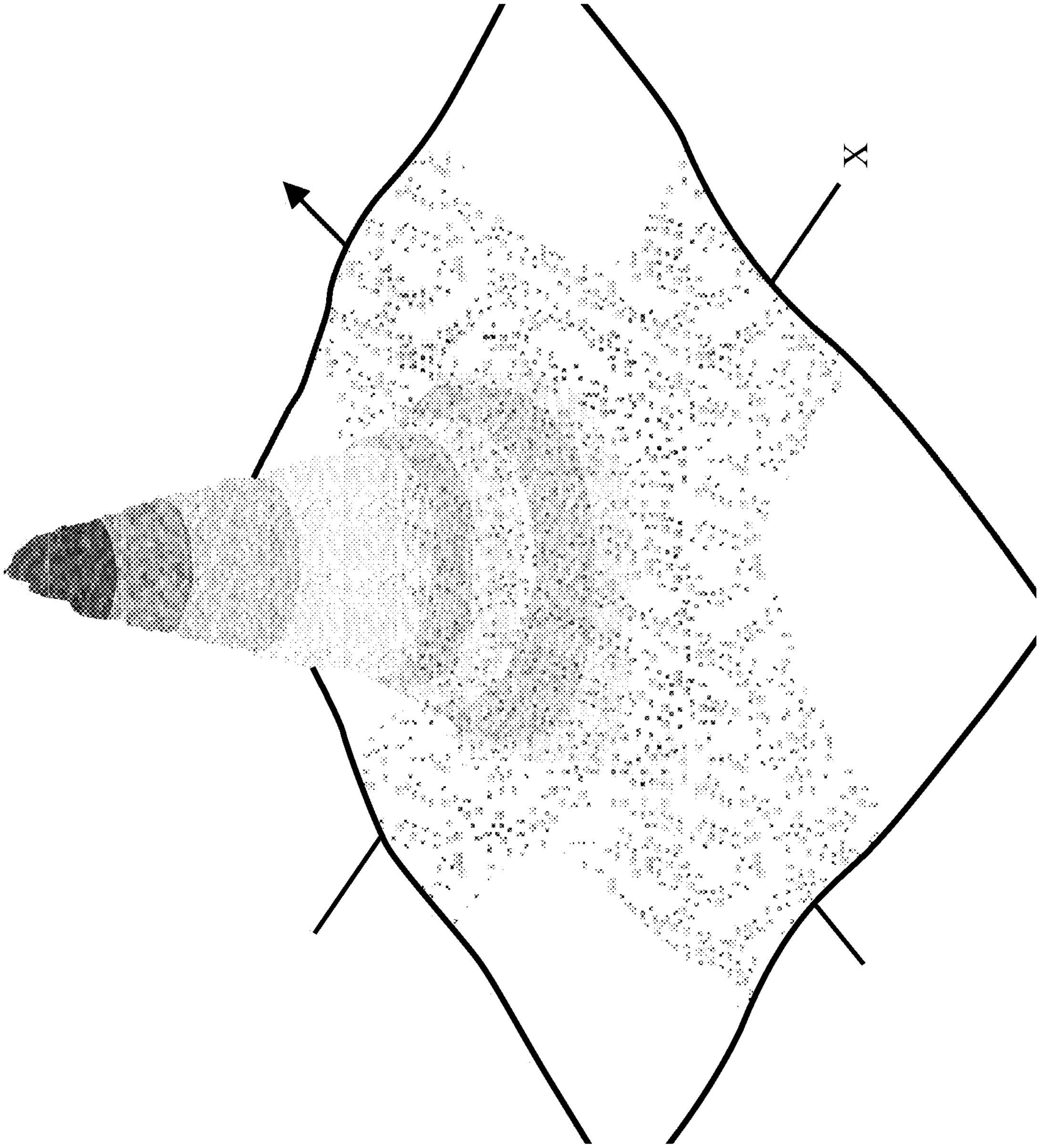
FIG. 7 illustrates an example of three-dimensional (3D) far field imaging, in accordance with one or more embodiments.
Figure 8:
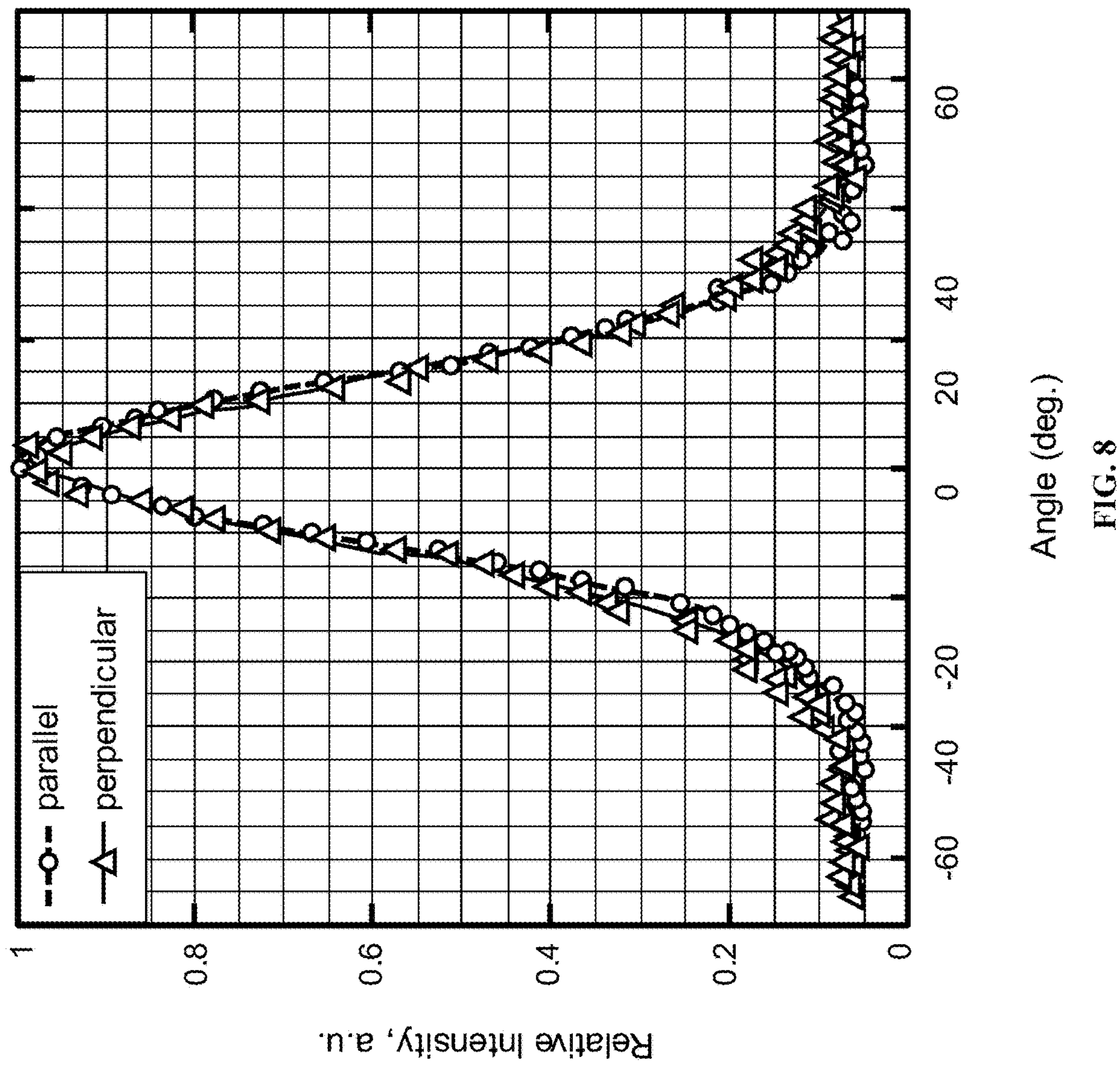
FIG. 8 illustrates an example of a far-field intensity profile that may correspond with the imaging of FIGS. 6-7, in accordance with one or more embodiments.

FIGS. 7-8 depict an example of symmetric beam laser far field measurement. For example, an EBL device may operate at 5 mW and have a 3.25 μm mask width. In this or another example, the FWHM $\theta_\perp$ may be 29.95°, FWHM θ|| may be 29.71°, with $M^2$ being 1.15 and 1.23, respectively. $M^2$ may indicate a measure of how close a beam is to an ideal Gaussian beam (for which $M^2=1$). These values may be under conservative test conditions (e.g., with no heatsink, pulsed less than 200 mA, and with 300 K operation), with $\theta_\perp/\theta_\parallel$ being substantially equal to 1.008, and the y-axis may indicate a far field (or relative) intensity arbitrary units (a.u.).

In some embodiments, silicon photonics (SiPh) may be employed, being a material platform from which photonic integrated circuits (PICs) may be made. Contemplated PICs may require strong optical confinement and low bend loss WGs to shrink component size and increase integration density.

In some embodiments, SOI wafers may be used, as the semiconductor substrate material, e.g., with many standard CMOS manufacturing processes being applied. For example, a laser or just its emitter may be integrated at a planar PIC. Disclosed embodiments demonstrate feasibility of sidewall-smoothing and passivating of wet thermal native oxides, e.g., for strong optical confinement WGs having low bend and low scattering losses required for photonic integration; the low bend loss may be inherent due to the HIC structure. In these or other embodiments, one or more edge-emitting lasers (EELs) may be on the chip with other modulators, detectors, and/or devices and involve wavelength multiplexing, and where the edge-emitted beam coming off the chip is circular.

Figure 18B:
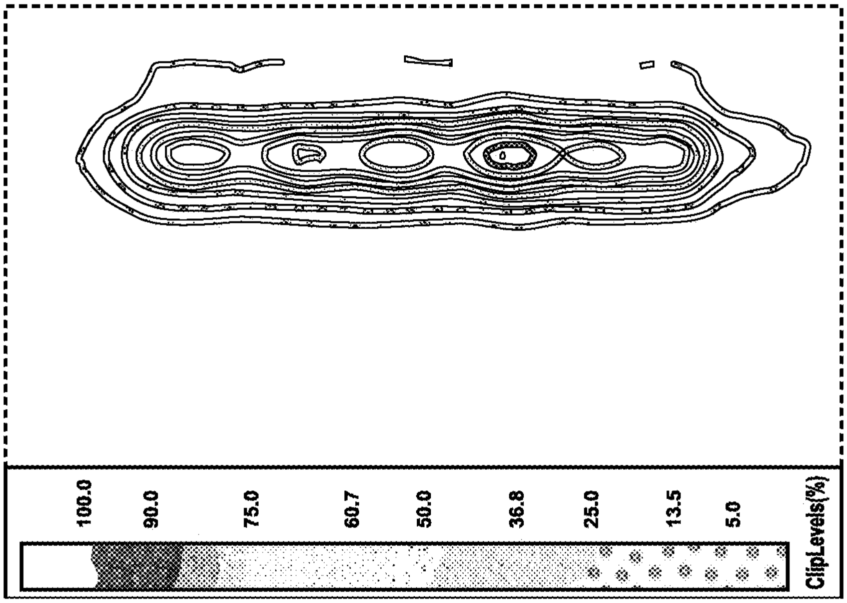
FIG. 18B (Prior Art)
FIGS. 18A-18B illustrate an example of multi-spatial-mode NFs, in accordance with the prior art.
Figure 18A:
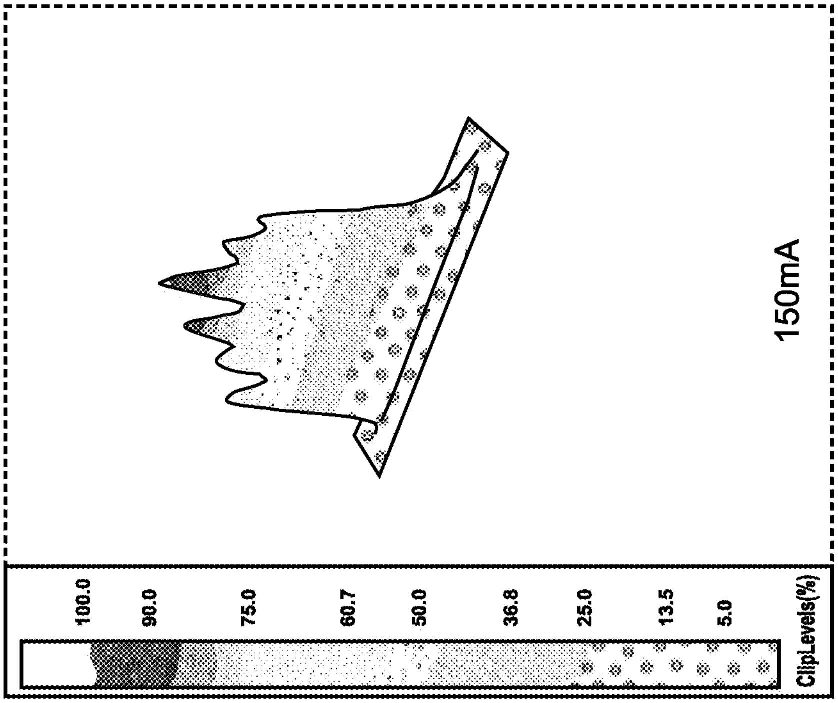
FIG. 18A (Prior Art)
Figure 19A:
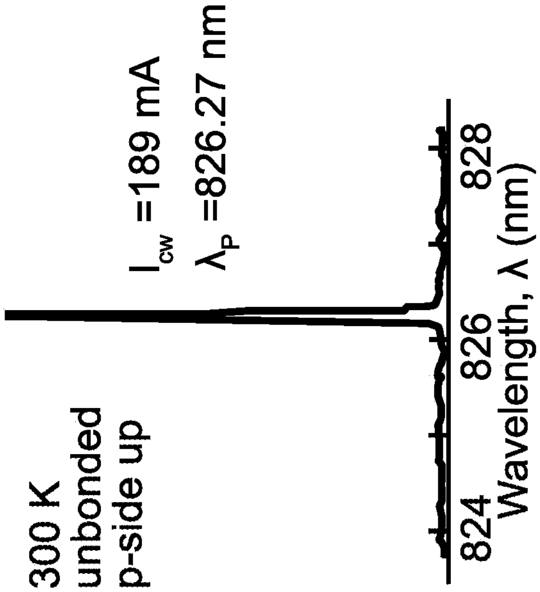
FIG. 19A (Prior Art)
FIGS. 19A-19D and 20-21 illustrate examples of prior attempts at device performance and/or generating a symmetric beam, in accordance with the prior art.
Figure 19B:
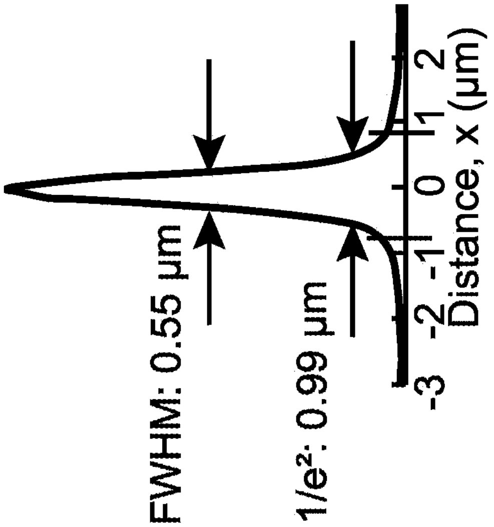
FIG. 19B (Prior Art)
Figure 19C:
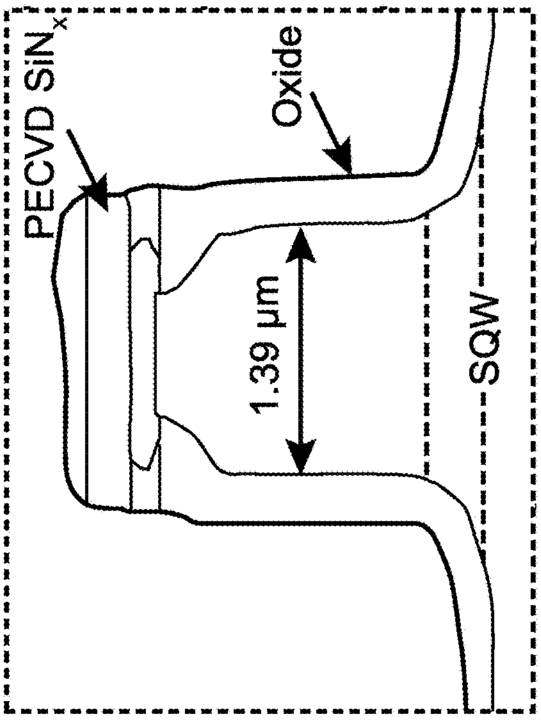
FIG. 19C (Prior Art)
Figure 19D:
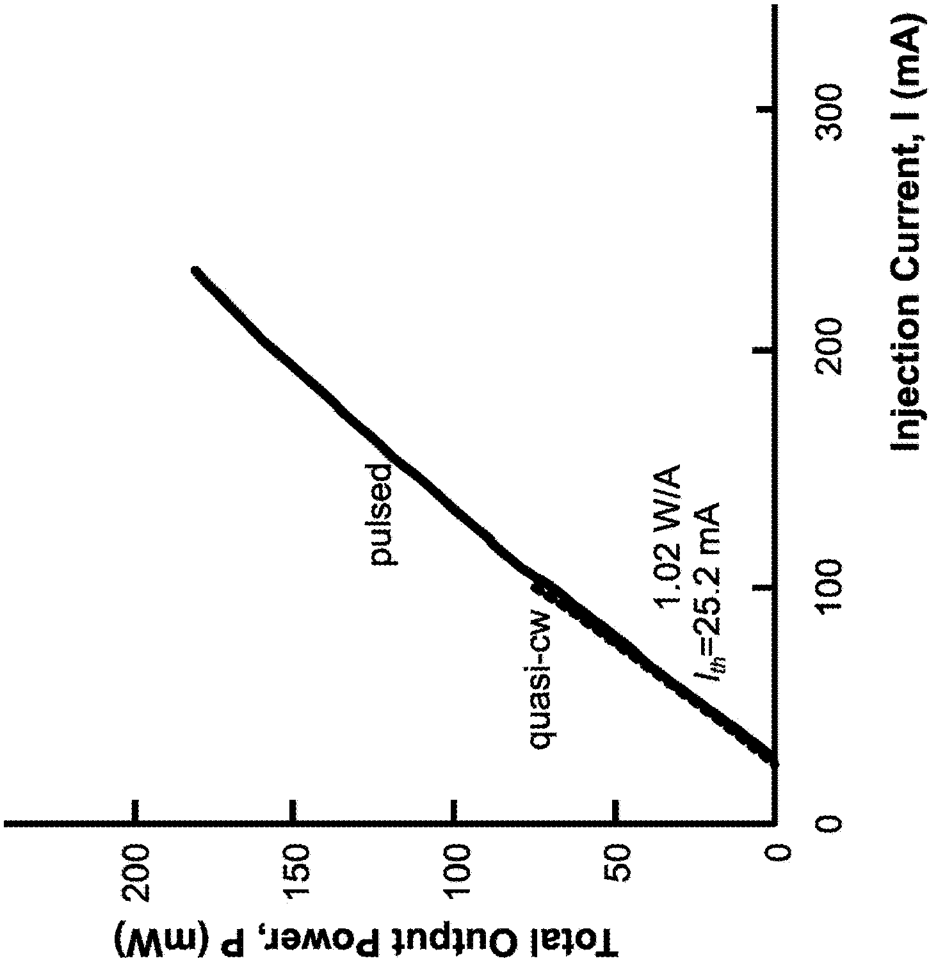
FIG. 19D (Prior Art)

In some embodiments, contemplated heterostructures of an edge-emitting laser may generate a high-power, small-spot-size, and symmetric beam. Reductions of elliptical output beam asymmetry (i.e., divergence angle ratio ($\theta_\perp/\theta_\parallel$)) are known to be as low as 1.23 for another lasing wavelength (λ) (e.g., which may be 808 nm) AlGaAs/GaAs QWH lasers, having a shallower-etched (mid-index-contrast) 1.39 μm oxide-confined active core width and yielding a 0.55 μm×0.99 μm $1/e^2$ width near field mode. As shown in other work depicted in FIGS. 18A-18B, a ridge mask width of 6.75 μm and a lasing device with 4-5 μm mask width are achieved. But known approaches have been unable to achieve a lowering of the oxide-confined active core width to about 0.56 μm, e.g., as would be required to yield a substantially symmetric ($\theta_\perp=\theta_\parallel$=32.4° output beam.

Contemplated GRINSCHs may be grown via metal organic chemical vapor deposition (MOCVD) and may feature a large asymmetric optical cavity design with a single indium gallium arsenide (InGaAs) QW offset. Such an approach may favor fundamental mode oscillation, and it may be sandwiched by $Al_xGa_{1-x}As$ barrier and cladding layers with Al composition ranging from x=0.1 to 0.6, and a lower InGaP/InGaAlP cladding layer, forming a structure well-suited to a non-selective oxygen-enhanced wet thermal oxidation process. The asymmetric SLOC design supports, e.g., 3 vertical WG modes, but only the lowest order (fundamental) mode has a large enough optical confinement factor (Γ, overlap of mode electric field with QW gain region) to achieve laser oscillation. The other modes do not have adequate gain to achieve laser oscillation due to their lower optical confinement factor. In a contemplated example, non-selective oxidation may effectively smooth and passivate the sidewalls of a deep-etched heterostructure ridge WG, overcoming the challenging issues of scattering loss and interface recombination.

Figure 3:
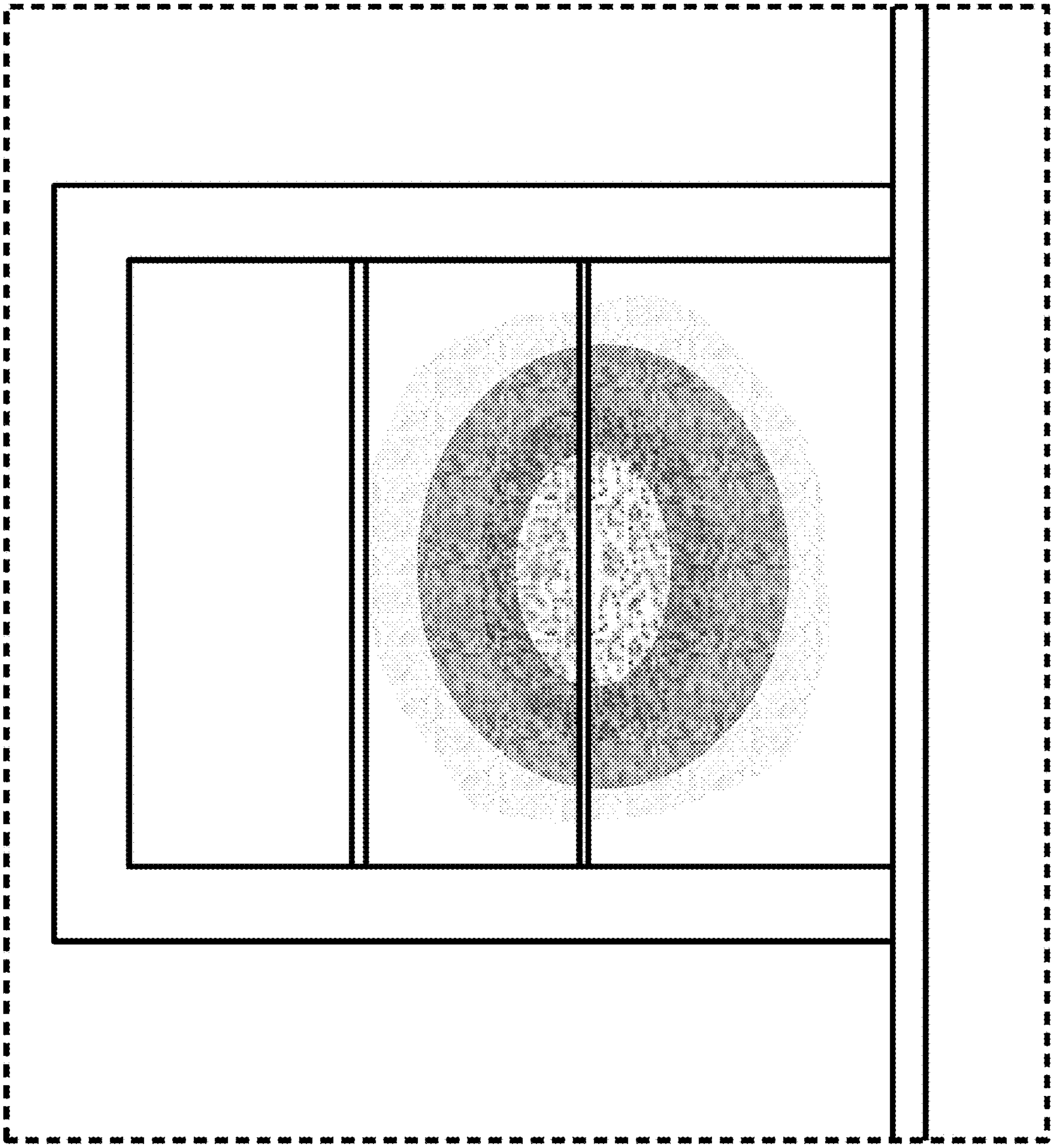
FIG. 3 illustrates an example of a symmetric mode simulation, in accordance with one or more embodiments.
Figure 4:
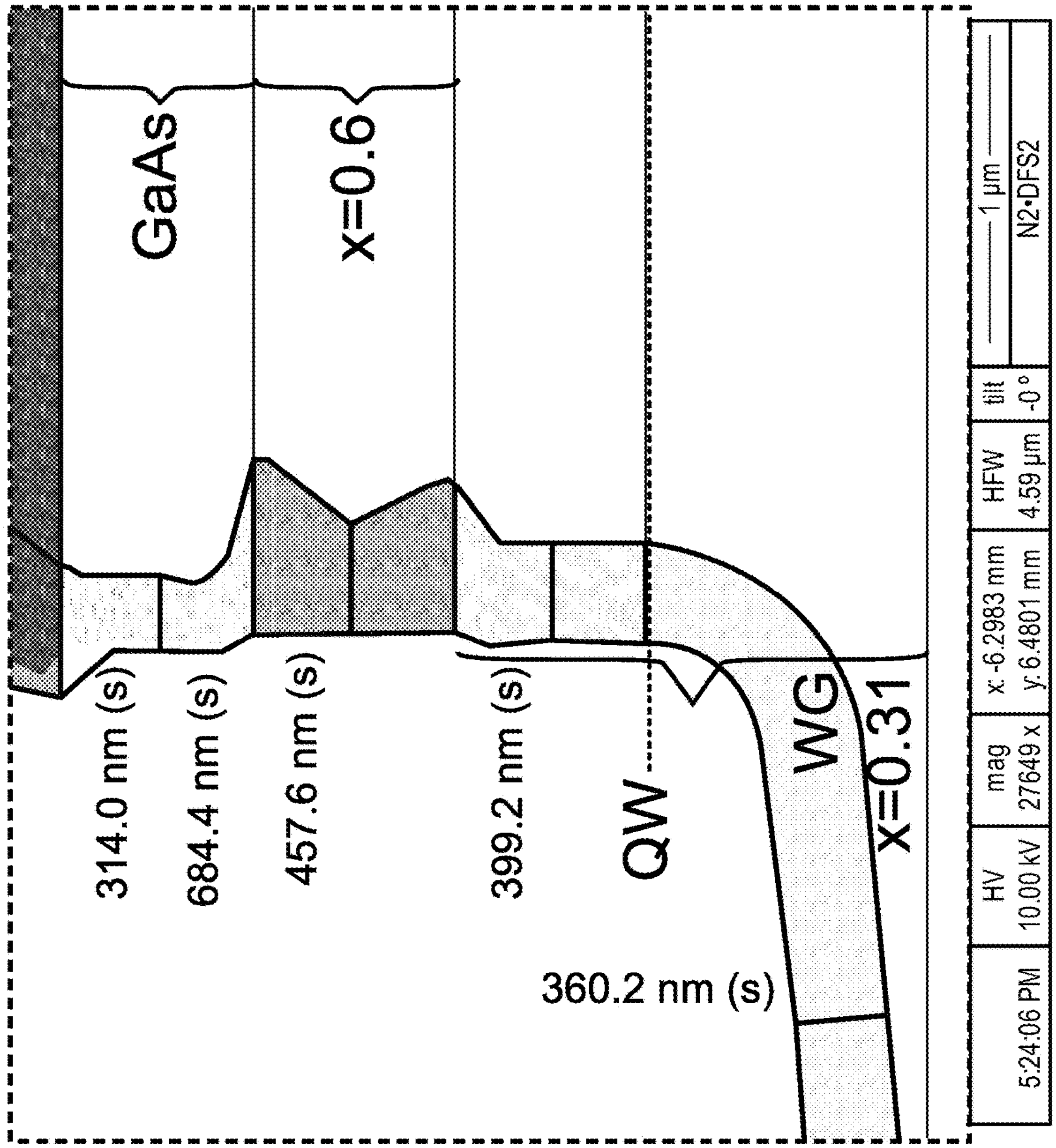
FIG. 4 depicts scanning electron microscope (SEM) imaging of a deep-etched AlGaAs heterostructure ridge sidewall after non-selective oxidation, in accordance with one or more embodiments.

Vectorial mode solvers (e.g., for 2D+Z WG structures), such as FIMMWAVE™, may be configured to produce simulations that give a fundamental mode lateral oxide-confined core width, e.g., of between 0.64 and 1.22 μm. In the example of FIG. 3, a 2.0 μm core width device may be provided to achieve a circular beam profile with a mode width of about 1.85 μm $1/e^2$ (e.g., in both horizontal and vertical directions). In some implementations, the fundamental mode may oscillate at this and somewhat wider widths due to increased scattering loss for higher order modes. For example, an oxide having a thickness of about 0.5 μm may be grown on each side of the ridge, as shown in FIG. 4. And an expected lithographic mask width required for a symmetric output laser may be relaxed to about 3 μm. As such, means for manufacturing and employing single spatial mode HIC RWG device 10 is contemplated.

Figure 26:
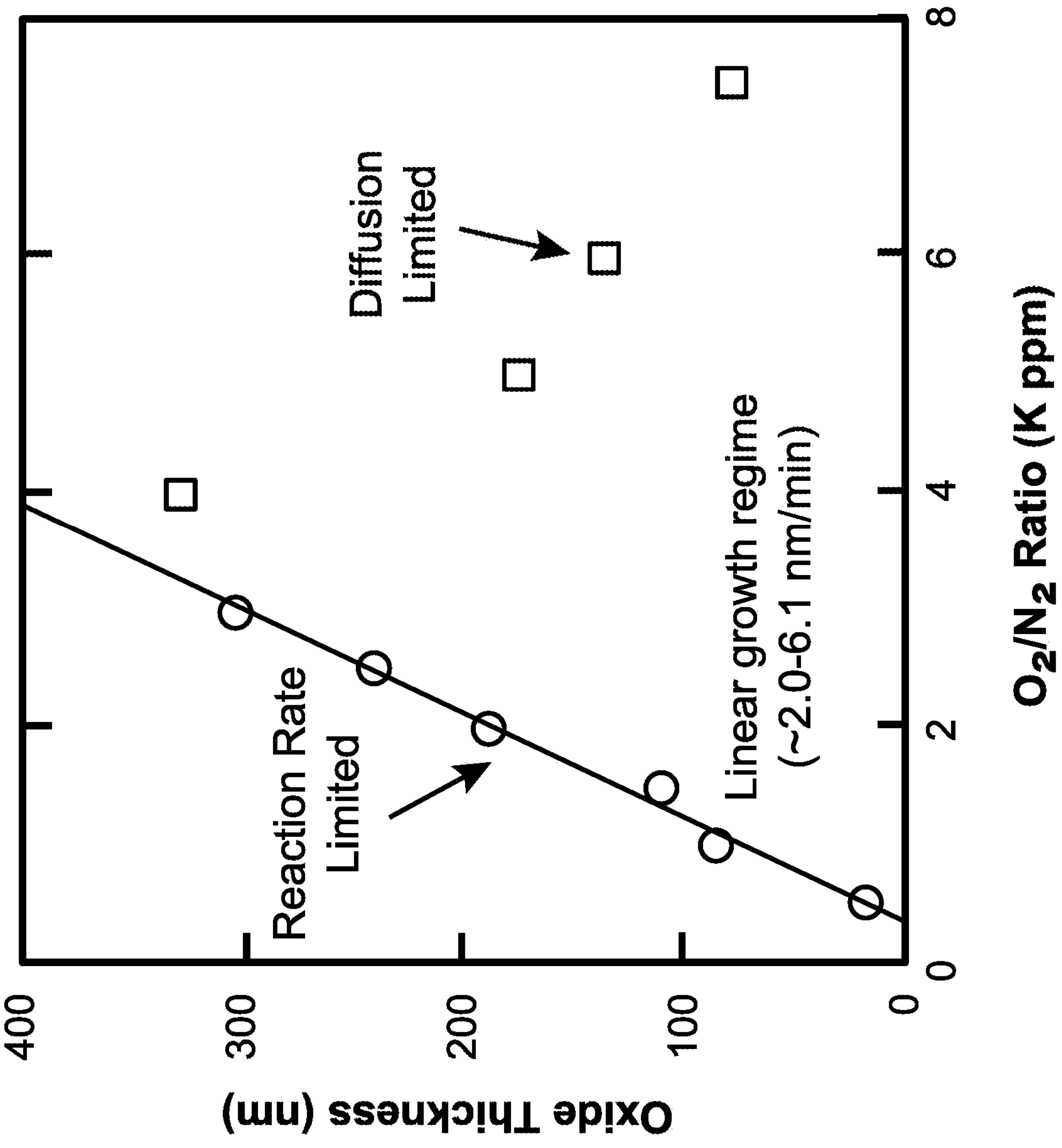
FIG. 26 illustrates an example plot involving oxygen-enhanced wet thermal oxidation at a deep-etched AlGaAs heterostructure ridge sidewall, in accordance with one or more embodiments.

FIGS. 4 and 26 depict a measurement and plot on oxygen-enhanced wet thermal oxidation, respectively; the example of FIG. 26 more particularly involves GaAs surface oxidation. In these FIGS., optimal conditions may be between 2000-2500 ppm $O_2/N_2$ at substantially 420° C. and for 81 minutes. This may be an example of best uniformity over a large area. In this or another example, surface roughness may be about 0.2 nm, and interface roughness may be about 2.7 nm. And there may be about 2.0-6.1 nm/min. linear oxide growth rate regime (e.g., 60 minute reaction rate limited oxidation) thickness, which varies linearly with time and increases linearly, with respect to added oxygen content when $O_2/N_2$ is less than or equal to 3000 ppm.

Figure 5:
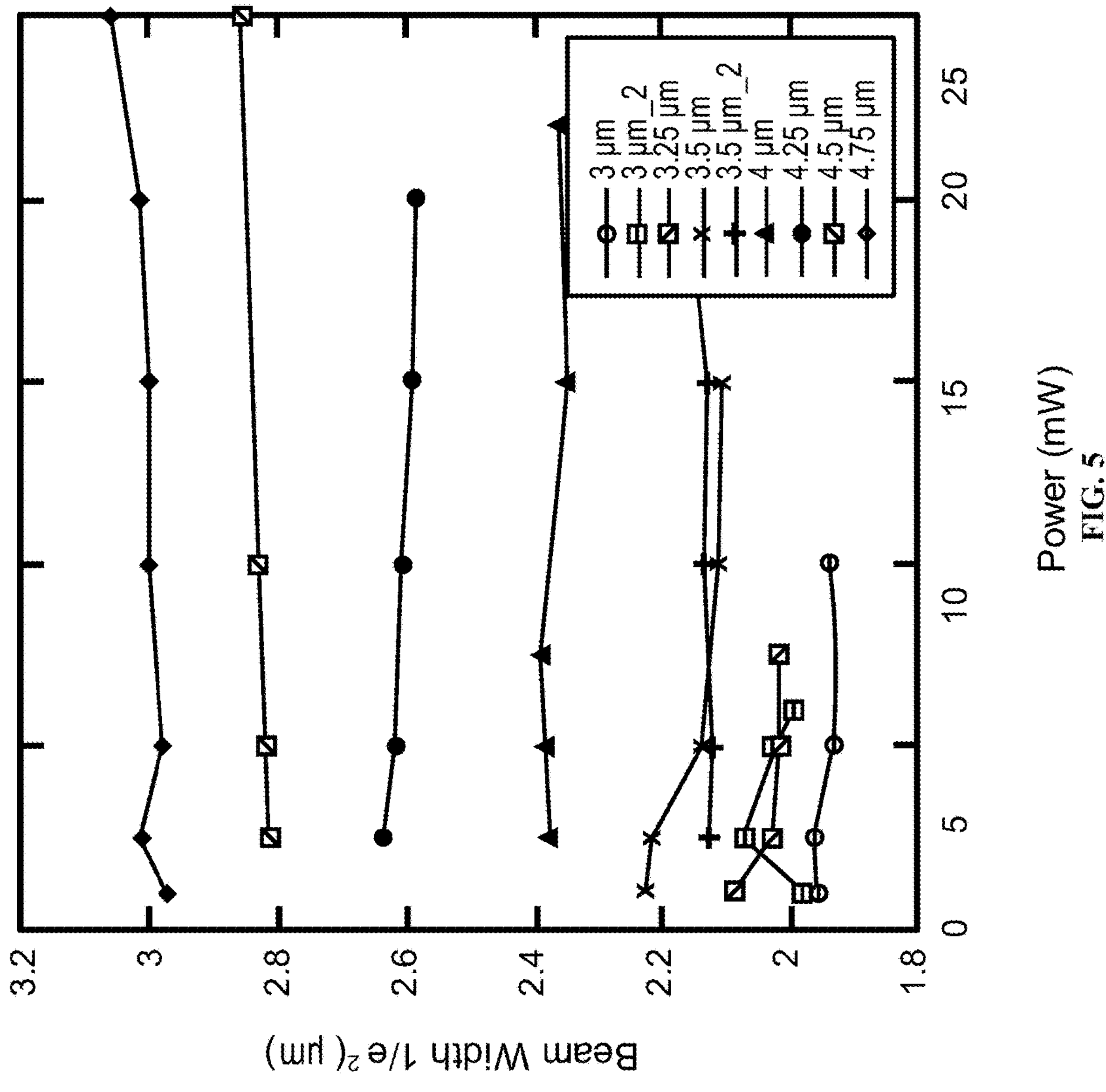
FIG. 5 illustrates an example plot of measured $1/e^2$ near field width versus power, in accordance with one or more embodiments.
Figure 6:
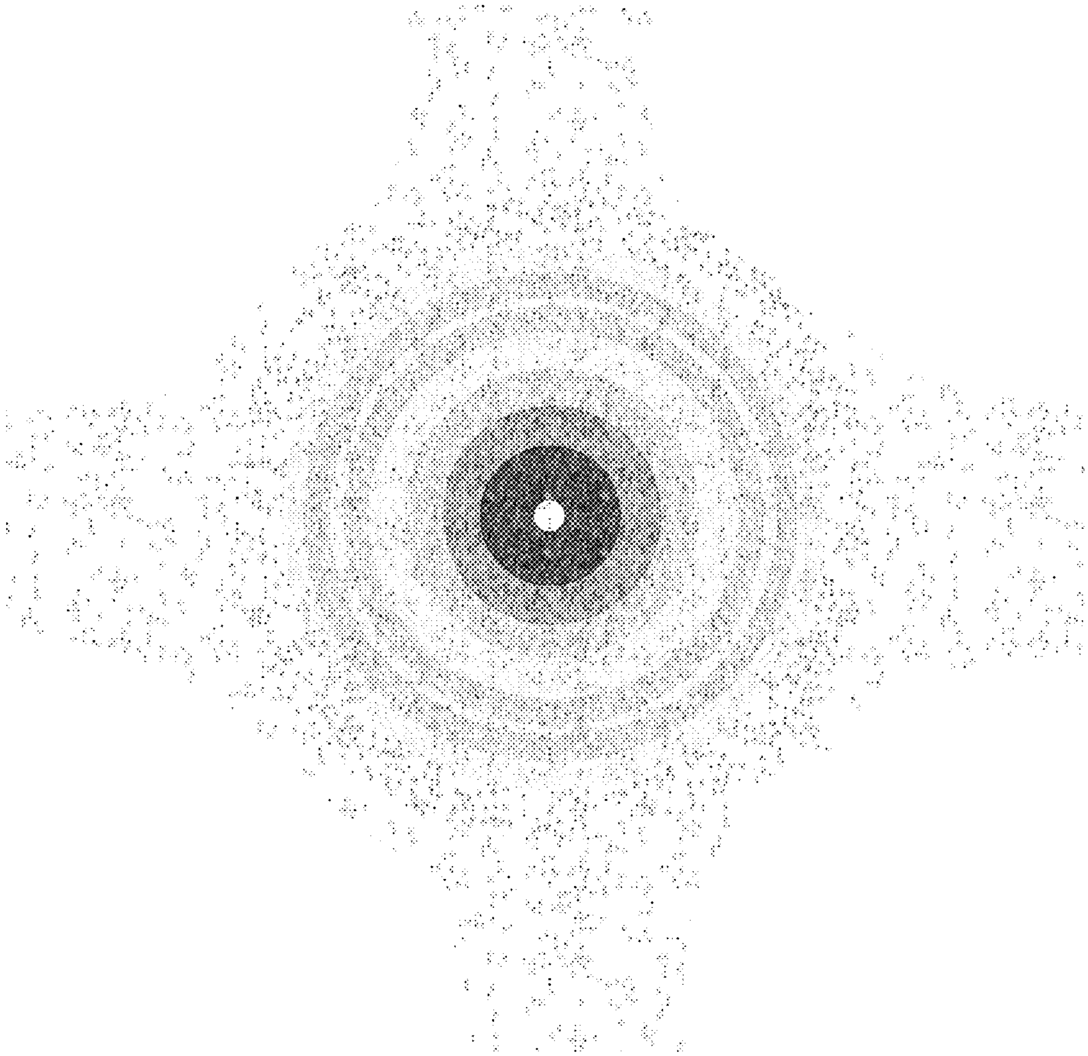
FIG. 6 illustrates an example of two-dimensional (2D) near field imaging, in accordance with one or more embodiments.

FIG. 5 exemplarily shows a plot of the single-mode lateral output beam width versus power, for several e-beam lithography (EBL) defined devices fabricated from mask widths between 3 and 4.75 μm. And FIG. 6 depicts a measured, circularly-symmetric mode. HIC RWG edge-emitting straight WG lasers 10 may thus be fabricated via EBL, in some implementations. For example, the mask width may be 3.25 μm at 5 mW, and NF $1/e^2$ widths may be 1.88 μm (X and Y).

In some embodiments, a maximum single mode $1/e^2$ width observed for contemplated EBL devices may be, e.g., 3.05 μm at 25 mW (e.g., from a 4.75 μm device). For a projection lithography laser set, devices with mask widths smaller than 5 μm may exhibit single mode operation. For example, a 4.5 μm mask width device may operate in a stable single spatial mode, while driven in pulsed mode (e.g., up to a total (2 facet) output power of 166 mW).

In some embodiments, contemplated AlGaAs heterostructure may have a larger optical cavity. In these or other embodiments, a deep-etched HIC RWG edge-emitting laser may be implemented, e.g., with a nearly perfectly circularly symmetric beam. The laser emission wavelength (λ) is unrelated to LOC dimension, λ being varied by changing the QW or quantum dot (QD) active region alloy composition and size and can range, e.g., from 0.63-1.5 μm for GaAs-based heterostructures.

FIG. 6 depicts an example of a 1.88 μm $1/e^2$ width symmetric 2D near field mode, and FIG. 7 depicts a corresponding 3D far field plot. And FIG. 8 depicts both perpendicular and parallel measured divergences of 01=0| being about 29.8° FWHM, e.g., from a 3.25 μm mask width EBL device (e.g., which may be conservatively operated at a single facet output power of 5 mW). For example, this device may not have a heatsink, but it may be pulsed, operated at room temperature, and have a lasing wavelength of 868.5 nm. FIG. 7 thus depicts an example of a circularly symmetric beam profile for an EBL-patterned HIC RWG device. The $1/e^2$ near field width may be 1.88 μm for both directions, which may correspond with the simulation of FIG. 3.

Contemplated means may generate beams that may be substantially diffraction limited, e.g., with a Gaussian fitting coefficient of 0.965 and 0.971 and with a beam quality factor $M^2$ of 1.15 and 1.23 for the fast and slow axes, respectively. Resulting from separate sweep testing, contemplated implementations may have a substantially similar 3.25 μm ridge, e.g., with a threshold current of about 81 milliamps (mA), slope efficiency of about 0.92 W/A, and/or a maximum (two facet) optical output power of about 101 mW or greater. And resulting from reliability testing, contemplated HIC-RWG oxide-confined lasers may have a wider stripe and be shown to have stable heatsunk continue-wave (cw) room temperature operation (above at least 8× threshold of, e.g., 20-25 mA and/or above 100 mW). For example, at least 1-3 orders of magnitude greater power output may be achieved (e.g., with regards to a vertical-cavity surface-emitting laser (VCSEL)), and suitable heat-sinking and optical coatings on the mirror facet may be provided to help with that achievement. Some contemplated implementations may have pulsed operation to even higher output powers. Semiconductor diode lasers routinely have some type of heatsink and mirror facet coatings when packaged as a product for use in applications.

Slope efficiencies (e.g., which may be greater than 1 W/A) may be achieved due to the structural elimination of current spreading and the effective passivation of the etch-exposed bipolar active region by a high-quality wet thermal native oxide.

In some embodiments, a single-emitter, single-mode VCSEL may provide a circularly-symmetric, narrow-divergence output beam. For example, the maximum output power may be substantially greater than known means, which may have a power output of about 2 mW. Known means for high symmetric beam power require anamorphic prism pairs, cylindrical microlenses, or integrated waveguide beam expanders to transform an edge-emitting laser output beam from elliptical to circular, which may add cost, add complexity, and/or unavoidably result in degradation of the quality and power of the optical beam.

By contrast, contemplated HIC RWG lasers may improve near symmetric single emitter edge-emitting laser geometry. For example, a known SCOWL device may have a very low confinement, a large core, lower divergence, and a long cavity, e.g., being optimized for a high output power and requiring higher drive current levels. Herein-disclosed SLOC heterostructures (e.g., with an asymmetric QW to suppress lasing operation of all but a lowest, fundamental mode) may enable a circularly symmetric mode edge emitter (e.g., laser). In some embodiments, HIC RWG laser 10 may operate at a significantly lower drive current and have an optical confinement that is much stronger and more symmetric. For example, resulting beam profiles may be more cleanly circular and/or more amenable to higher modulation speeds (e.g., owing to its much smaller mode volume).

In some embodiments, a three-mode WG may be manufactured. For example, an asymmetric QW, having a very narrow layer where the electrons and holes recombine, may be made for the active layer. In this or another example, the active layer may be at the peak of the fundamental or the lowest order WG mode. But at a certain position there may not be a suitable overlap with the second and third modes of the WG, those two higher order modes existing in the WG without contributing to the laser's lasing. That is, a device may be made to have a broader WG and a lower power density at the facet, but it still may only lase in the fundamental mode.

In some embodiments, HIC RWG laser 10 may be compatible with conventional laser heterostructure designs and require significantly lower drive current. In these or other contemplated structures, the mode volume (e.g., which may be based on a size of the optical mode) may be much smaller (e.g., under 2 or 3 μm rather than greater than 5 μm). In implementations having a low index step between the core and the cladding of a WG, the mode may be caused to be bigger while maintaining it in a single mode. This may, in some instances, not be employed when modulating the device. In some implementations, higher modulation speeds may be produced, e.g., by coupling this light (with or without a tapered lens) to an optical fiber for communicating at gigahertz type frequencies. For example, a resistance-capacitance (RC) time constant may be reduced, either via the contact resistance or the capacitance of the herein-disclosed structure.

Some contemplated structures may have a lower capacitance because the oxide (e.g., which may be close to the WG active layer and confining it) may have a much lower refractive index than the semiconductor otherwise there, i.e., when not performing deep etching. In these or other structures, the optical refractive index may be about 1.6-1.7, e.g., being based on the dielectric constant. The refractive index may be the square root of the dielectric constant. Disclosed embodiments may thus have a low dielectric constant material as opposed to the semiconductor, e.g., which may typically have a constant that is double or more.

In some embodiments, due to a relatively large divergence angle of about 30° from edge emitting HIC RWG laser 10, a micro-lens system may comprise a tapered lens fiber (e.g., to achieve high butt-coupling efficiency to a single-mode fiber). The much more circularly symmetric output of the laser described here relative to conventional fiber coupled lasers can result in higher optical coupling efficiency to the fiber and/or eliminate the need for additional micro-lenses often needed to match conventional edge emitter laser outputs to optical fibers. Means for generating output beams, having a sufficiently high quality for several different free-space and/or focused-beam applications, are contemplated herein. For example, contemplated laser imaging, detection, and ranging (LiDAR) may involve automotive needs. In this or another example, disclosed structures may have different quantum well or quantum dot active regions, for generating eye-safe laser emissions. And feasibility of using sidewall smoothing and passivating wet-thermal oxides may be achieved in fabricating low loss high optical confinement deep-etched WGs (e.g., which may be additionally suitable for multiple low-bend loss photonic integrated device applications).

In some embodiments, deeply-etched oxide-confined GaAs-based HIC RWG structures may have low surface roughness (e.g., 0.2 nm) and low interface roughness (e.g., 2.3 nm) native oxides grown directly on GaAs or AlGaAs, e.g., with highly specular optical properties involving performance of, e.g., a quarter wave optical thickness antireflection layer. These oxides may, e.g., be grown directly on a diode laser etched or cleaved facet mirror to passivate the surface, suppress minor degradation, and/or alter reflectivity. In some embodiments, an etched facet may be formed at the same time as the etched HIC RWG sidewall and simultaneously oxidized and grown to a thickness suitable for a useful mirror passivation coating, eliminating need for additional facet passivation coatings. Through extensive optimization of lithography, etching, and oxygen-enhanced wet thermal oxidation (OEWTO) processes, a single mode HIC RWG diode laser may be achieved. Oxidation smoothing of the semiconductor/oxide interface sidewall roughness, along a propagation direction of oxide-confined HIC RWG structures, may be directly observed, e.g., via focused ion beam milling and electron microscopy.

Figure 24:
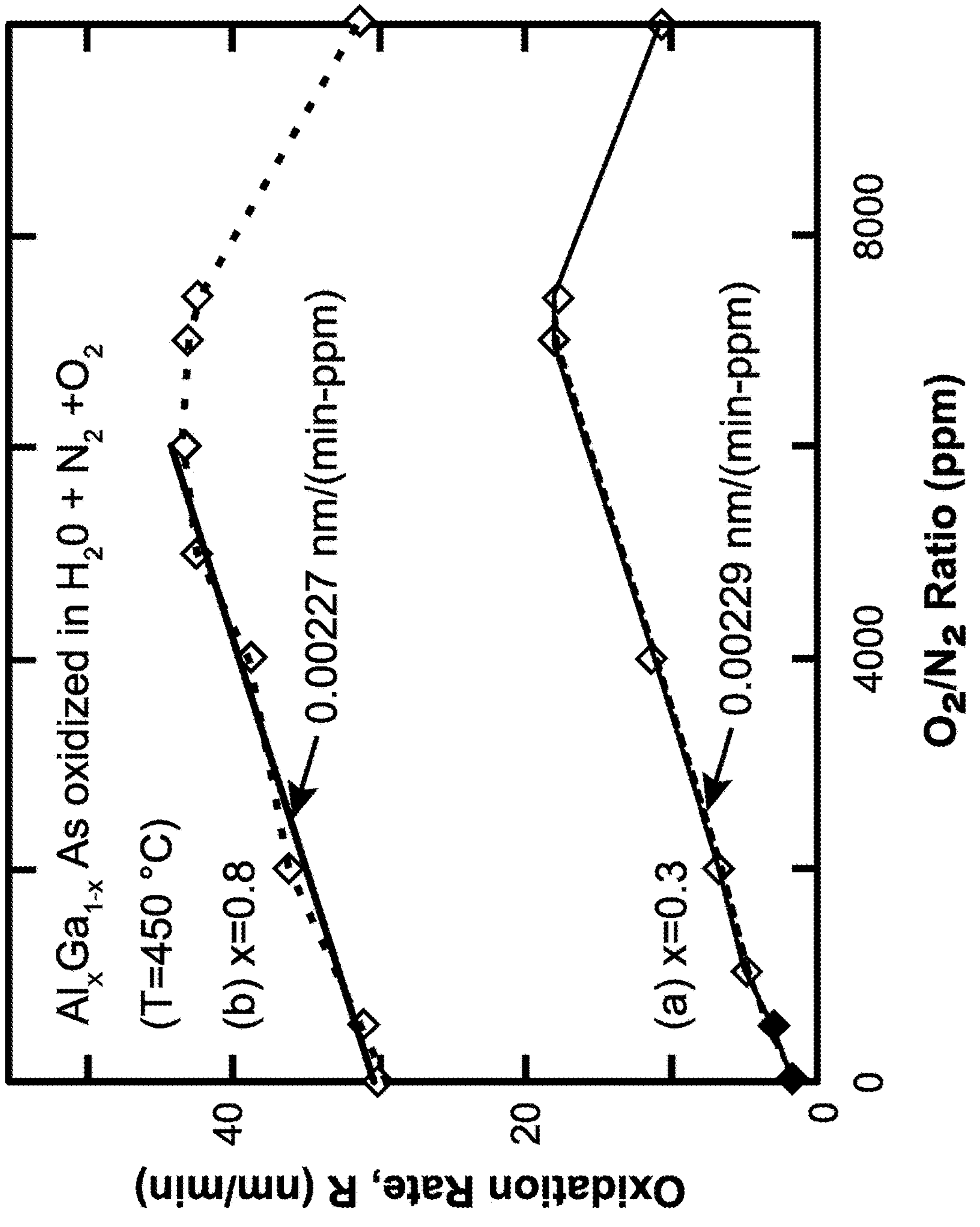
FIG. 24 (Prior Art)
FIGS. 24-25 depict an oxygen-enhanced wet thermal oxidation (OEWTO) process, in accordance with the prior art.

FIGS. 24-25 depict aspects of a seasoning process, e.g., to properly prepare an oxidation system for successful growth of oxygen-enhanced wet thermal oxidation process (OEWTO) oxide films. For example, a certain amount of time (e.g., 10-12 hours) may be required for inner sidewalls of quartz furnace tube and stainless steel gas delivery tubing to reach an equilibrium state of water vapor and/or oxygen adsorption and desorption rates. As such, it is contemplated to combine an OEWTO HIC RWG process with the SLOC, including such process optimization steps as the mentioned process chamber seasoning.

A contemplated OEWTO layer may serve to ameliorate dry-etch damaged bulk regions to overcome limitations of non-radiative recombination centers in deep-etched semiconductors. For example, oxidation smoothing may reduce sidewall scattering loss, and an OEWTO film may be grown beyond passivation of surface states at just the original or ultimate semiconductor/oxide interface. In this or another example, the oxide may be configured to provide sufficient surface passivation of a deep etch-exposed bipolar active region to minimize nonradiative recombination. And simultaneous electrical passivation may be, e.g., at an interface of the native oxide and WG core. Additional bulk states may lie, though, within the semiconductor 10*s* or 100*s* of nm from the surface due to the penetration of and damage by energetic ions during the reactive ion etching (RIE) process. The WG width may be further shrunk through use of inductively coupled plasma (ICP)-RIE, which may generate lower levels of ion damage within the material by using separate electrode plates to accelerate the ions downward during etching from those used to generate/energize the plasma. For example, more gentle etch control may be allowed. Ion damage from ICP-RIE, however, may still exist and extend beyond just surface states, which may be attributed primarily to dangling bonds at the unterminated crystal surface, and which can be passivated using an appropriate deposited dielectric such as an atomic layer deposition (ALD) aluminum oxide. To be clear, there are differences between surface and bulk defects. The conversion of RIE etch-damaged semiconductor material close to the etched surface to a high quality, low defect amorphous native oxide may also improve optoelectronic device performance. That is, this inwardly growing film may also serve to shift the oxide/semiconductor interface to a point beyond the extent to which the ion damaging from dry etching penetrates into the bulk. As such, the inwardly growing oxide consumes the etch damaged semiconductor, allowing the oxide/semiconductor interface (which may also become the edge of the active region and the lateral WG core/cladding interface) to reside within pristine, undamaged semiconductor material to thus lower the level of ion damage defect-induced nonradiative recombination.

Figure 20:
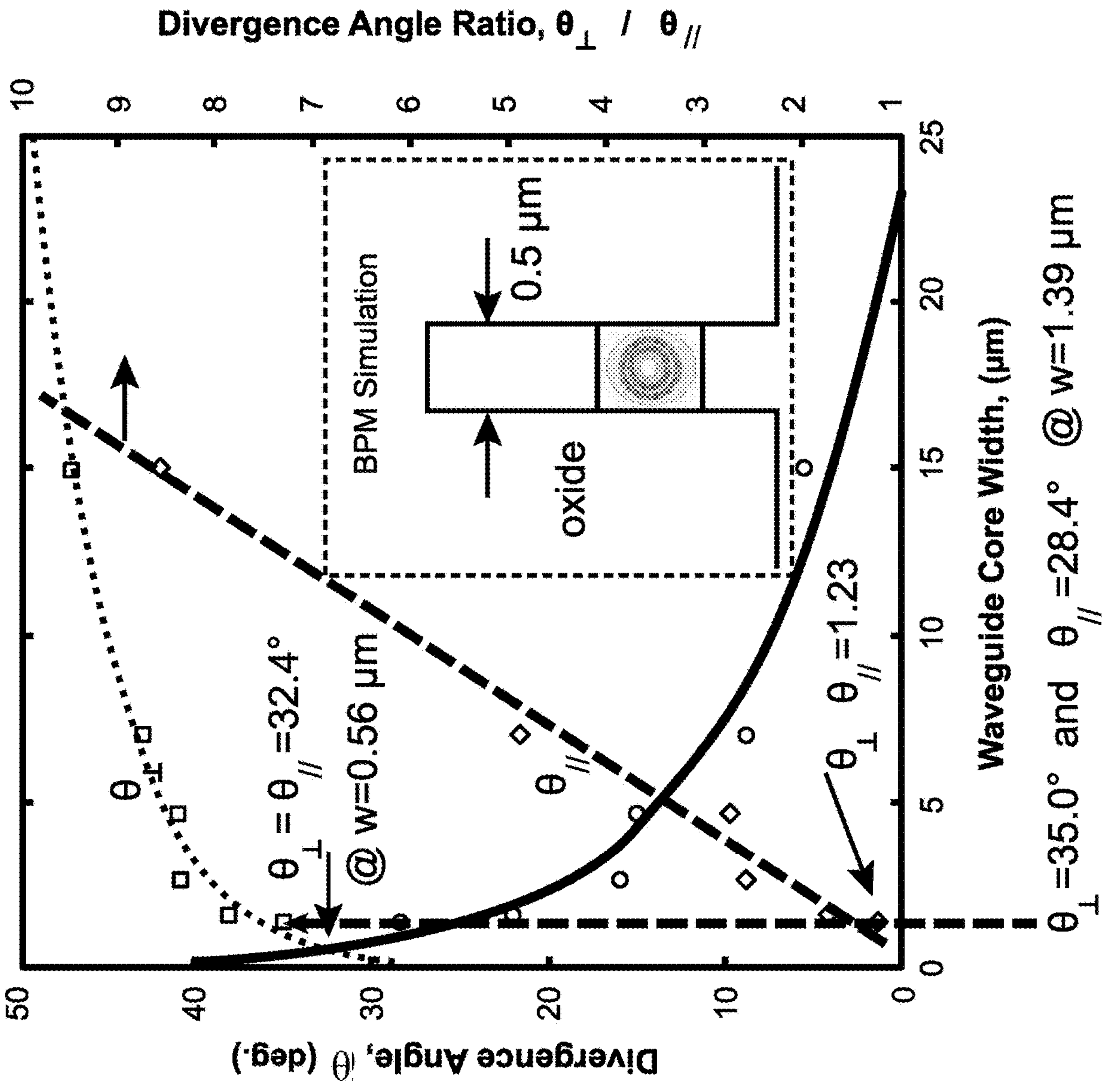
FIG. 20 (Prior Art)
Figure 21:
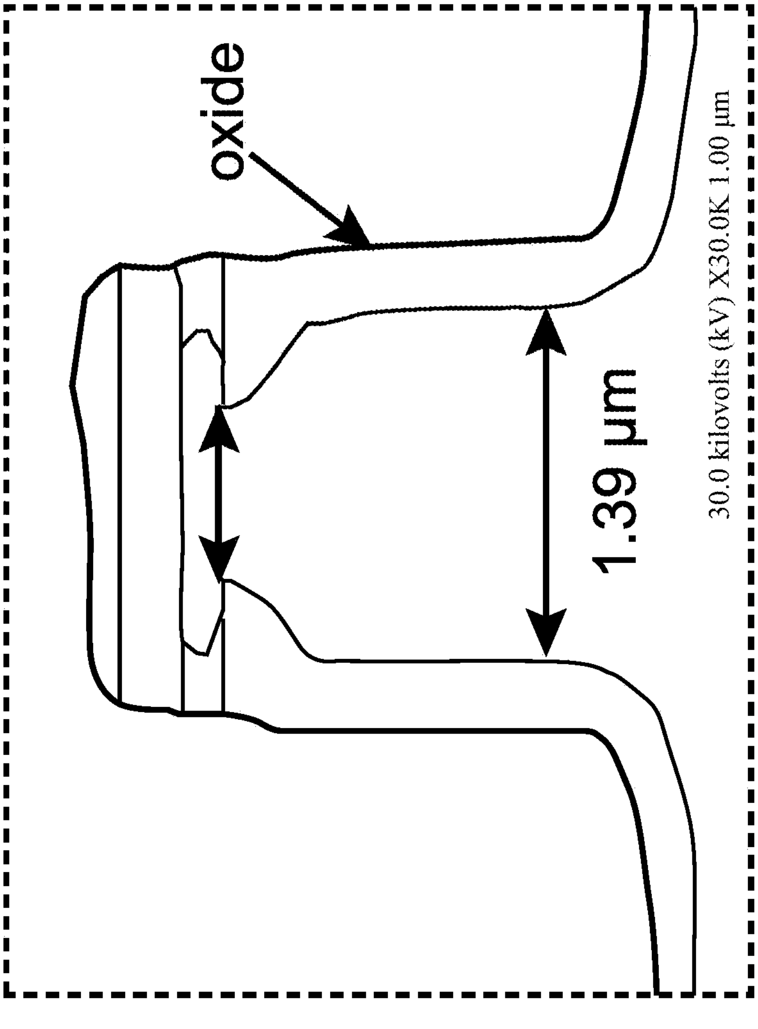
FIG. 21 (Prior Art)

FIGS. 19A-19D depict prior progress towards device performance and/or generation of a symmetric beam. For example, the shallow RIE may be above the QW, with an oxide of about 0.25 μm under conditions of 20 minutes, 450° C., and 4000 ppm $O_2$. FIGS. 20-21 similarly illustrate prior progress towards generating a symmetric beam. In these examples, a one to one (1:1) symmetric mode dimension may be unattainable due to oxide pinch off and high scattering loss. Contemplated means for generating a symmetric beam may be largely based on device geometry (e.g., waveguide dimensions), but emission spectra (e.g., showing power versus wavelength) may be based on the QW active region thickness and/or semiconductor alloy composition.

In some embodiments, HIC RWG laser diode 10 may be manufactured with a high external differential quantum efficiency (e.g., substantially about 65%), stable single-mode, and high beam quality (e.g., with $M^2$ being about 1.2 and 2 being about 880 nm) GRINSCH and may output a circularly symmetric beam (e.g., overcoming known any asymmetric, highly elliptical beam divergence limitations of edge-emitting lasers and exceeding 2 mW maximum power of current symmetric single mode vertical cavity surface emitting lasers). In these or other embodiments, HIC RWG laser 10 may have an oxide-confined deeply-etched 3.25 μm wide ridge that may produce a single mode laser, e.g., with a 1.88 μm $1/e^2$ near-field mode width and FWHM far field divergence of 29.95° and 29.71° in the fast and slow axes, respectively. For example, herein-disclosed structures may use GaAs-based AlInGaP QW active regions to extend emission λ to visible wavelengths (e.g., 0.63-0.7 μm), or GaAs-based QD or InGaAsN QW active regions or InP-based InAlGaAs or InGaAsP alloy laser heterostructures to extend emission λ to eye-safe and telecommunications bands (λ=1.3-1.55 μm).

Figure 22:
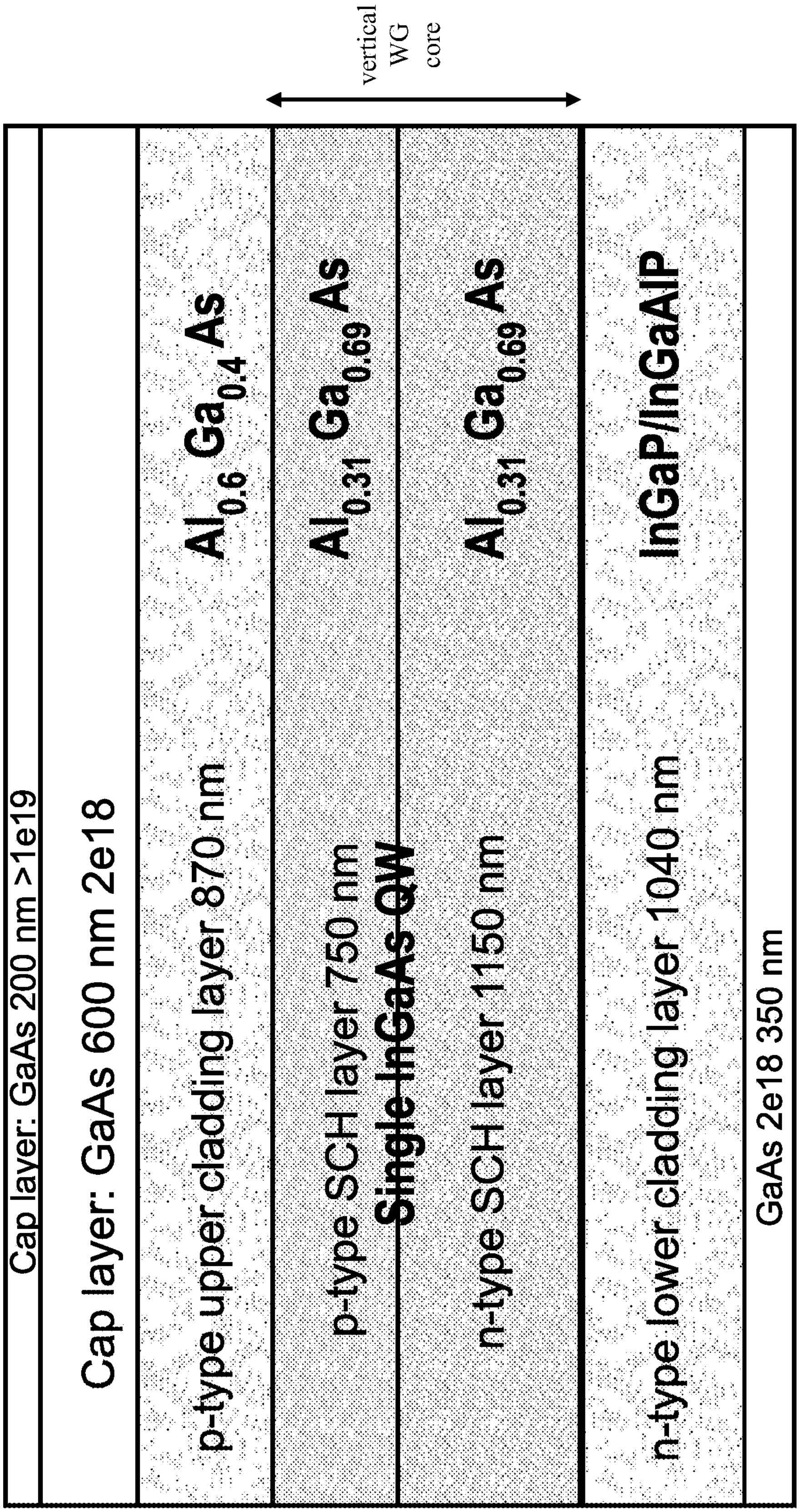
FIGS. 22-23 depict a GaAs-based, quantum well (QW) heterostructure (QWH) laser, in accordance with one or more embodiments.
Figure 23:
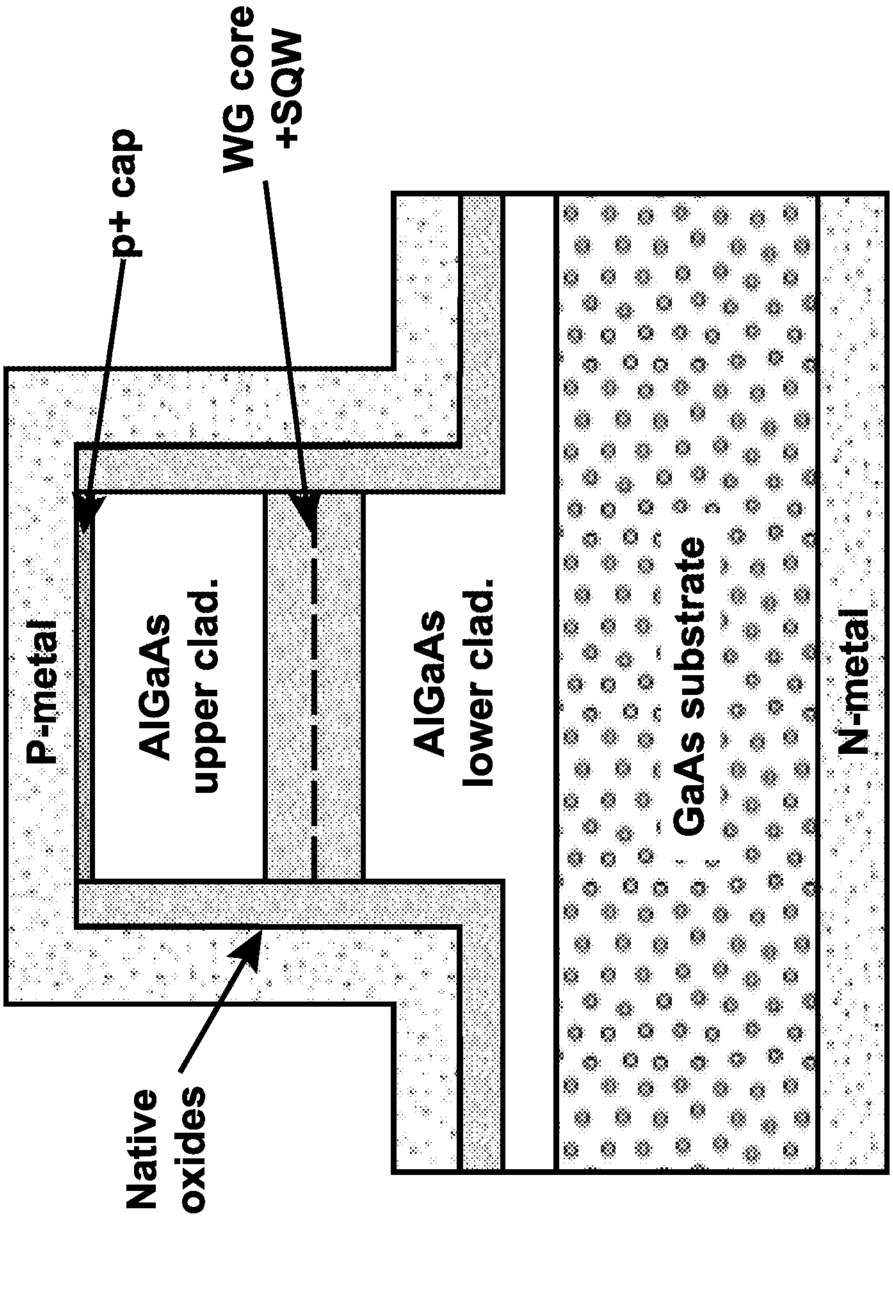

For example, FIGS. 22-23 depict a GaAs-based QWH laser, e.g., with λ being about 885 nm. This structure may have, e.g., a minimum etch depth for HIC of substantially 2.42 μm, and the optical cavity may be large and asymmetric. An offset single InGaAs QW may favor fundamental mode lasing. The lower cladding layer may, e.g., enable a LOC to be manufactured into a SLOC. But contemplated processes may be applied to different heterostructures, e.g., having a smaller vertical divergence angle, to generate a smaller divergence circular beam.

Contemplated epitaxially-grown heterostructures may provide for a good optical confinement factor (e.g., overlap of optical field and gain) in the vertical growth direction. In some embodiments, contemplated heterostructures may be buried, employing layer disordering or etching and regrowth techniques to improve laser beam quality. Contemplated GaAs-based in-plane semiconductor lasers may be realized, e.g., by combining a deep anisotropic etch through the heterostructure WG followed by a non-selective $O_2$-enhanced wet thermal oxidation process. For example, HIC RWG 10 may eliminate lateral current spreading and provide a high lateral optical confinement factor. In this or another example, a high-power edge-emitting laser may be efficient and have nearly-symmetric output beams. Benefiting from the strong optical confinement offered by a herein-disclosed HIC interface, contemplated in-plane WGs may be sharply bent to route optical signals or form ring oscillators with negligible bending loss.

Figure 28:
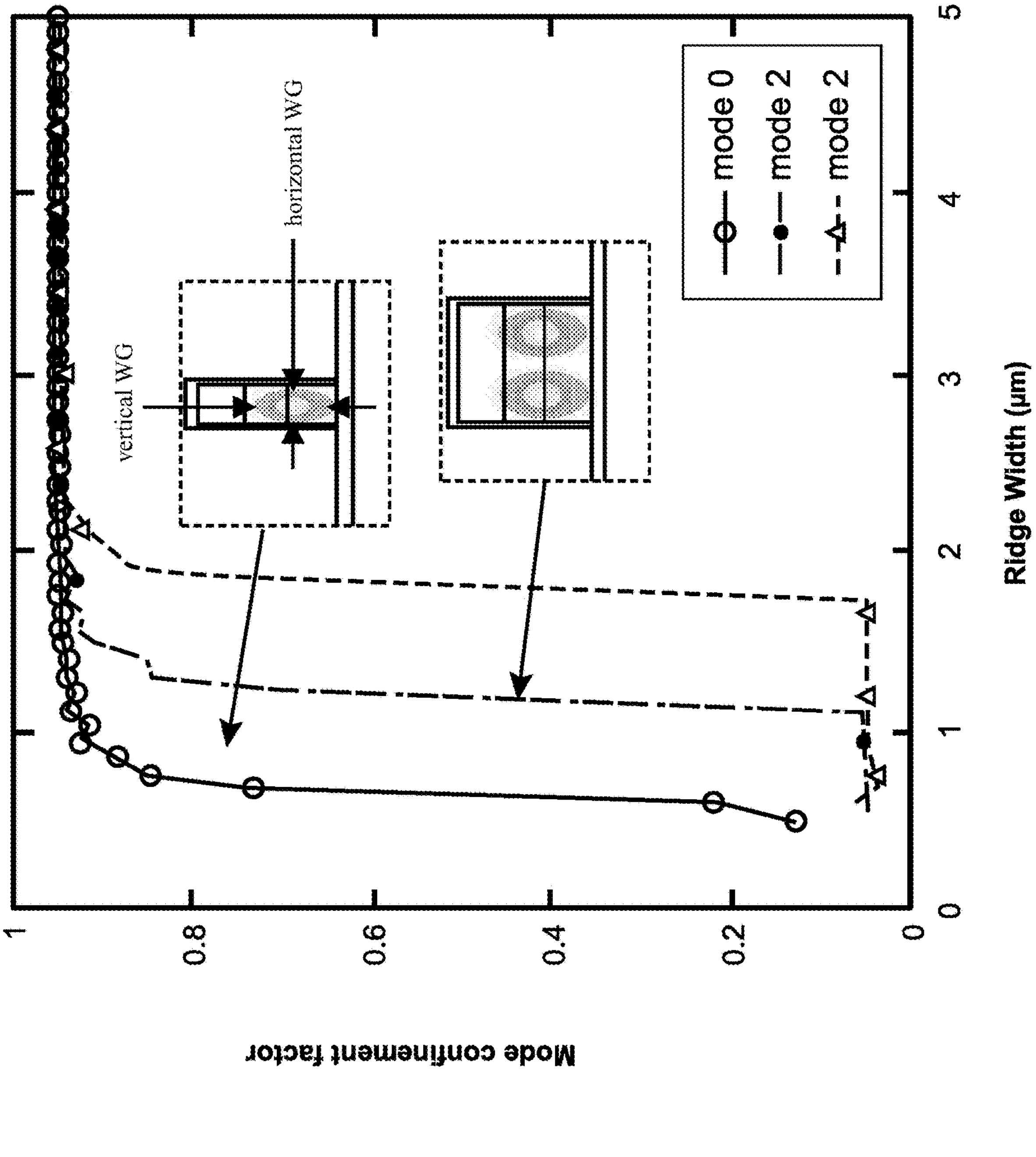
FIG. 28 illustrates oxide-confined mode confinement simulations, in accordance with one or more embodiments.

In some embodiments, an output beam may be made symmetric, e.g., via confinement of the horizontal WG. For example, etching may be performed, and an oxide may be grown on the sidewall. In this or another example, this dimension may be roughly comparable to a dimension of the vertical WG, which may be built into the heterostructure. FIGS. 22 and 28 show examples of such dimensioning.

In some embodiments, a substantially symmetric beam may be achieved by narrowing a stripe width to a criterion satisfying extent, e.g., when etching through the active layer. The structure of contemplated embodiments may be deep-etched, e.g., through the whole active region etched. In a deep-etched structure, which may expose the bipolar active region sidewall, passivation of non-radiative recombination centers from surface states or etch-damaged material may be performed for achieving good active semiconductor device performance.

In other embodiments, the etching may be less extensive, e.g., by stopping around the upper WG core/cladding interface (which may be above the active layer, indicating actuality of a mid- or medium-index contrast device rather than deep). Deep-etching herein refers to etching through the active regions. For example, the heterostructure may have lower and upper WG cladding layers, which may be sandwiching the confinement layer for the electrons and holes. In this or another example, the QWs may be in the middle, and that may be where the electrons and holes recombine, e.g., with N-doping on one side and P-doping on the other side; there may thus be a diode junction there. In those other embodiments having less extensive etching (e.g., where the etch stops just above the WG core layer), the oxide may be grown through the WG core, being another contemplated approach to producing an HIC. For example, this may be achieved by the oxide semiconductor index difference, e.g., being grown down from the top as opposed to being grown in from the sides.

Without substantial scattering loss, disclosed embodiments may control a herein-mentioned optical problem based on one or more sidewall smoothing improvements, e.g., via a contemplated oxidation process. In these or other embodiments, non-radiated recombination of electrons and holes may be achieved in related to sidewall defects (e.g., from the dry etching that the oxide is passivating). An extent of a contemplated stripe width, though, may not need to be so narrow that it satisfies a narrower criterion.

In some embodiments, a stripe width may be configured for the vertical and horizontal WGs to be comparable, and a size of the mode that was confined may be more relaxed. For example, a contemplated SLOC WG may be configured with a suitable width, for the output beam to be symmetric.

In some embodiments, contemplated circular beam lasers may have a low astigmatism, indicating an ability to focus the beam sharply in both axes simultaneously (e.g., for coupling power to fibers or WGs for applications needing a sharply focused beam spot, such as laser printing or CD burning). For example, astigmatism may be substantially eliminated, e.g., without additionally using (e.g., external) optical elements.

Figure 27B:
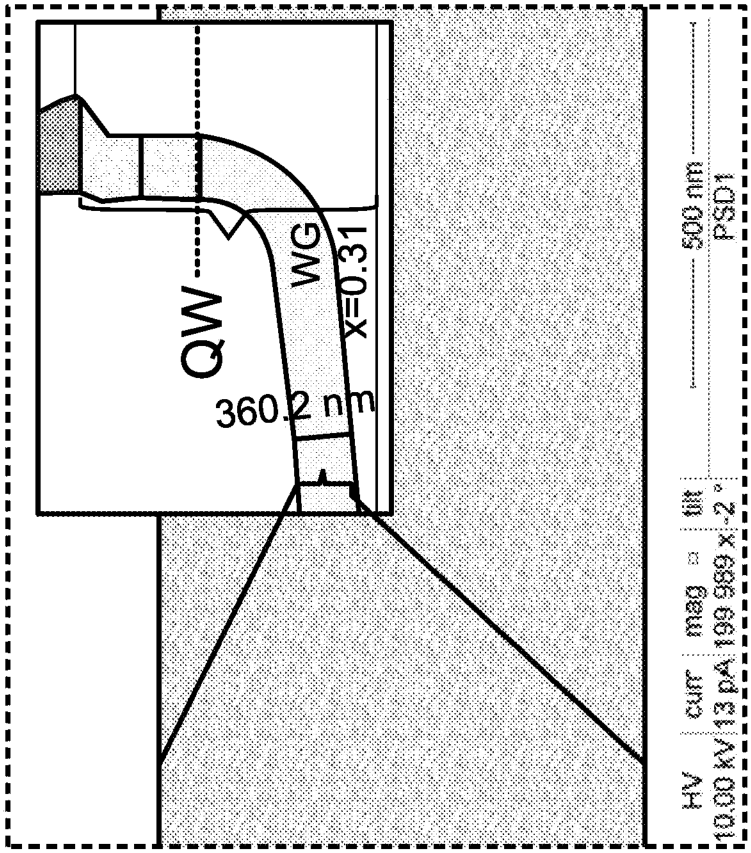
FIGS. 27A-27B illustrate examples of AlGaAs oxidation with excessive or optimal $O_2$, in accordance with one or more embodiments.
Figure 27A:
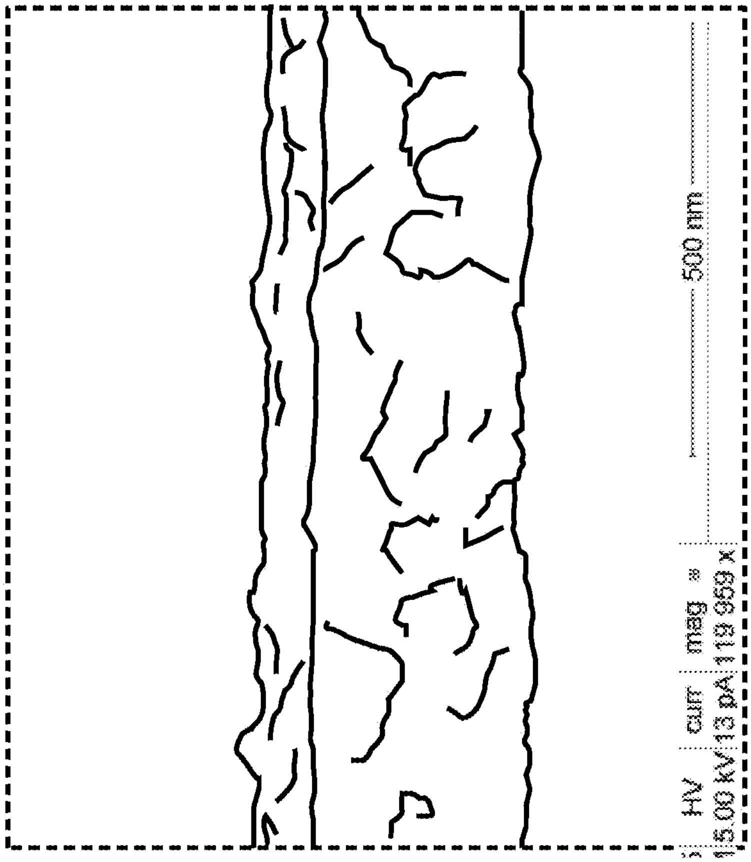

FIGS. 27A-27B depict $Al_{0.31}Ga_{0.69}As$ oxidation. More particularly, an excess amount of $O_2$ is shown versus optimal $O_2$. For example, an extreme miss may occur when $O_2$ is excessive, causing a grainy, dense As rich film, which may in turn cause a large current leakage as shown in FIG. 27A. But FIG. 27B depicts optimized conditions, having an oxidation rate of 10.8 nm/minute (min.).

FIG. 28 illustrates oxide-confined mode confinement simulations, in accordance with one or more embodiments. For example, a vectorial mode solver such as FIMMWAVE may simulate photon design, e.g., with a mode 0 of core width about 0.64-1.22 μm. Higher order mode lasing may be suppressed due to higher scattering loss as higher order modes have electric field strength at the sidewall interface and thus experience greater scattering loss.

Figure 29:
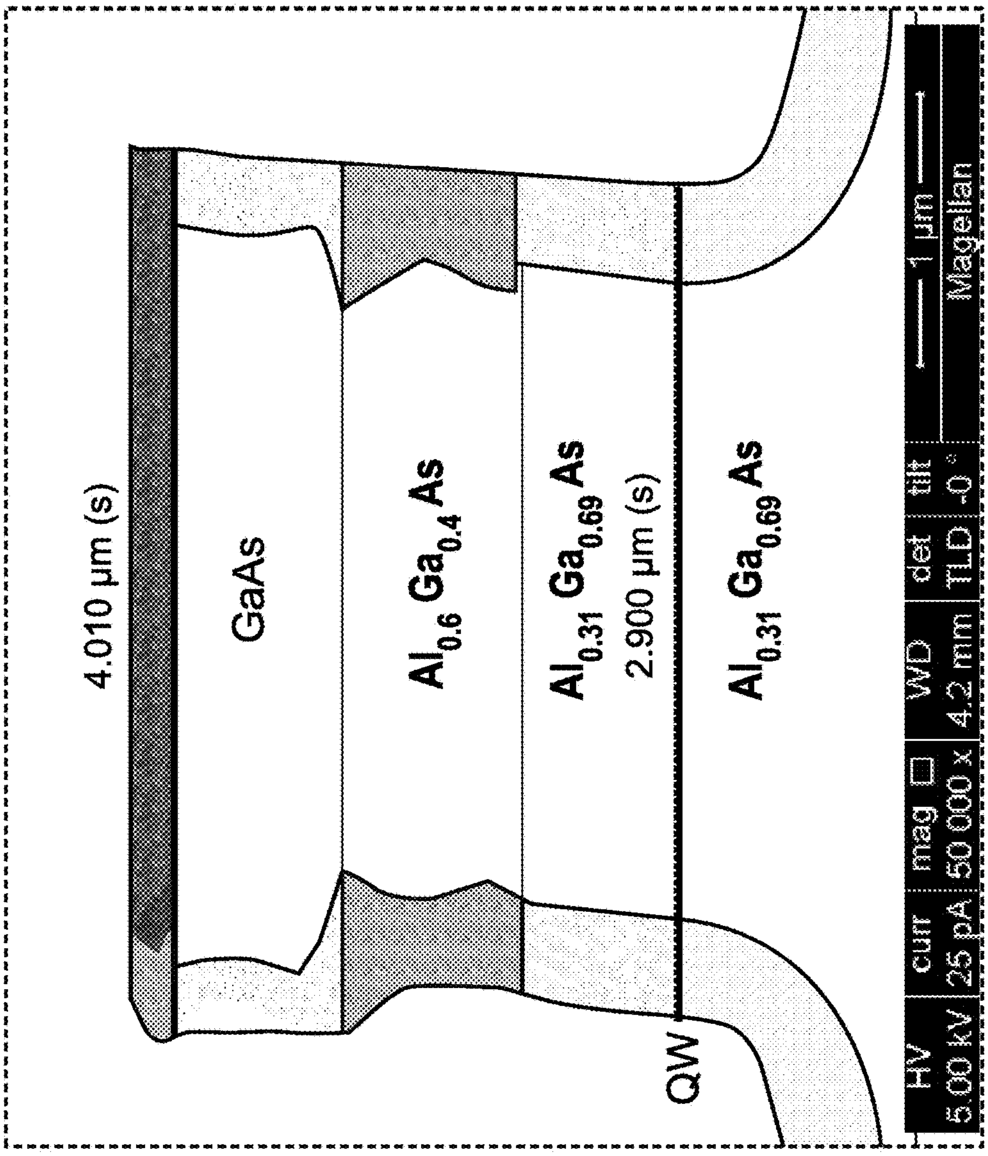
FIG. 29 illustrates an oxide-confined HIC RWG, in accordance with one or more embodiments.

FIG. 29 illustrates an oxide-confined HIC RWG, in accordance with one or more embodiments. For example, there may be no pinchoff of the current path. An oxide may be used to better shrink the confinement dimension. There may be a low RC time constant, the mask width may be 4.0 μm, and an oxide thickness may be 0.56 μm such that the WG core width is 2.9 μm.

Figure 32B:
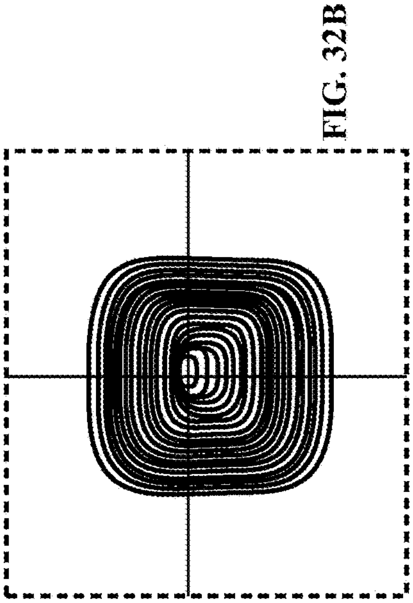
FIGS. 32A-32C illustrate near field (NF) convergence towards a symmetric beam, in accordance with one or more embodiments.
Figure 32C:
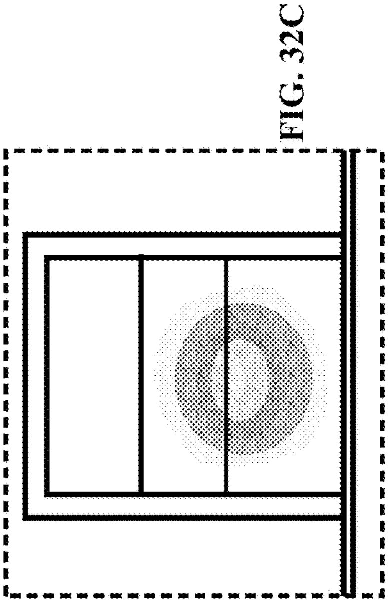
Figure 32A:
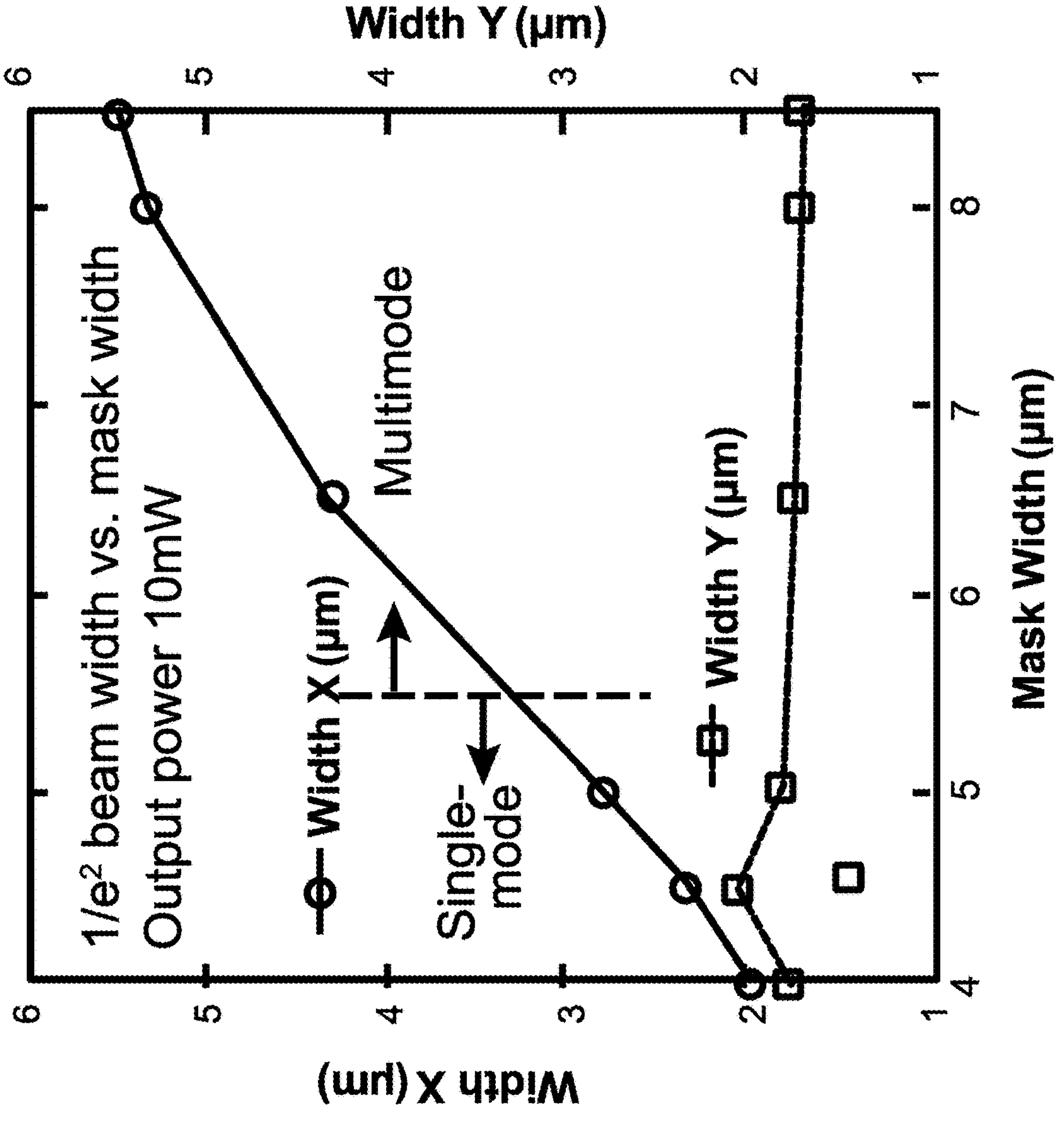

FIGS. 32A-32C illustrate near field (NF) convergence towards a symmetric beam, in accordance with one or more embodiments. For example, the core may be 2 μm, and the oxide may be 0.2 μm. In this or another example, the Simulated symmetric mode may be about 1.85 μm $1/e^2$ width (X and Y).

Figure 33:
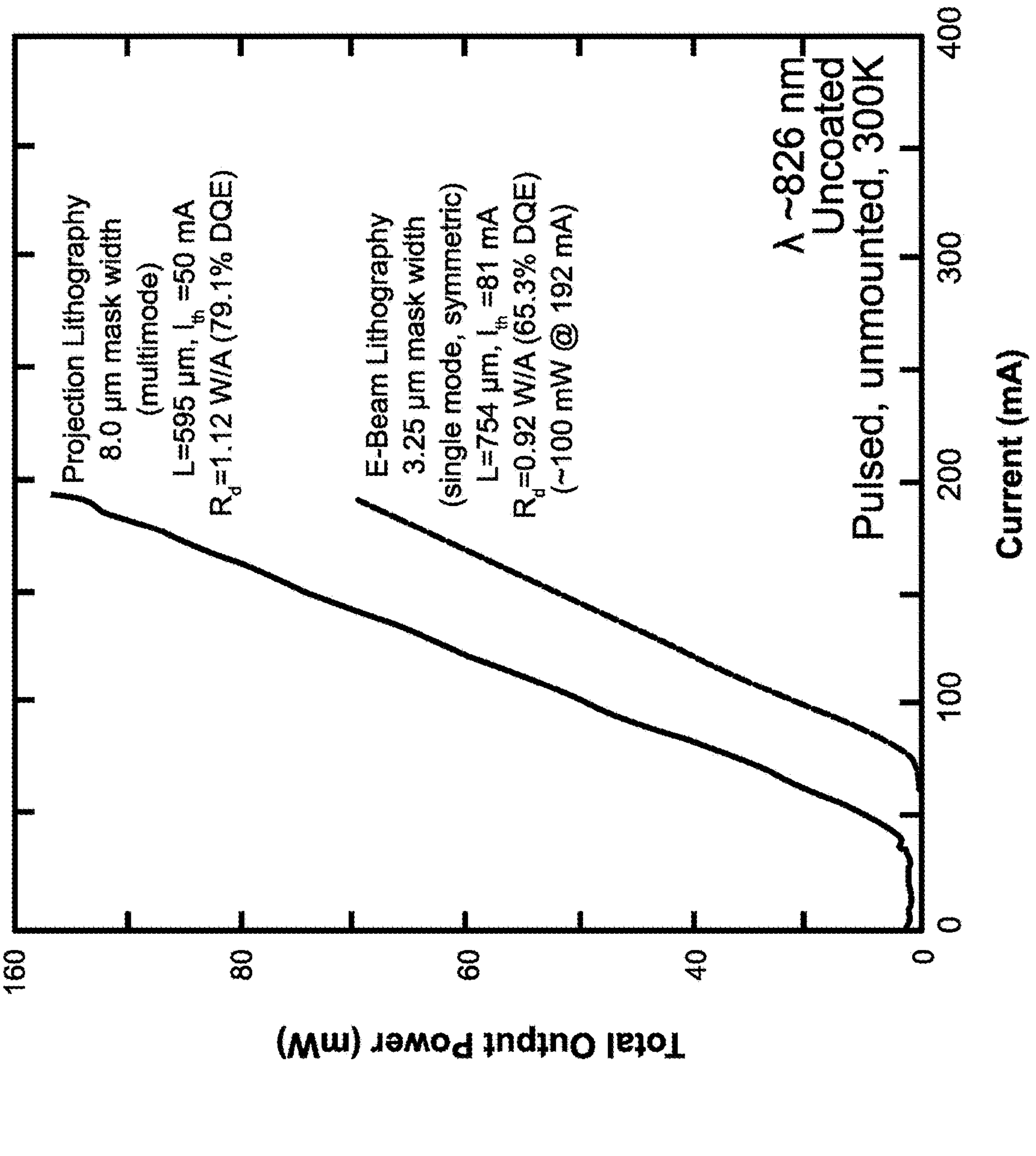
FIG. 33 illustrates laser output power plotted versus current, in accordance with one or more embodiments.

FIG. 33 illustrates laser output power plotted versus current, in accordance with one or more embodiments. In this example, heatsinking may be used, and prior multimode 808 nm oxide-confined HIC RWG lasers may be caused to be stable and kink-free cw, e.g., with 300 K operation to greater than an 8X threshold.

Figure 34:
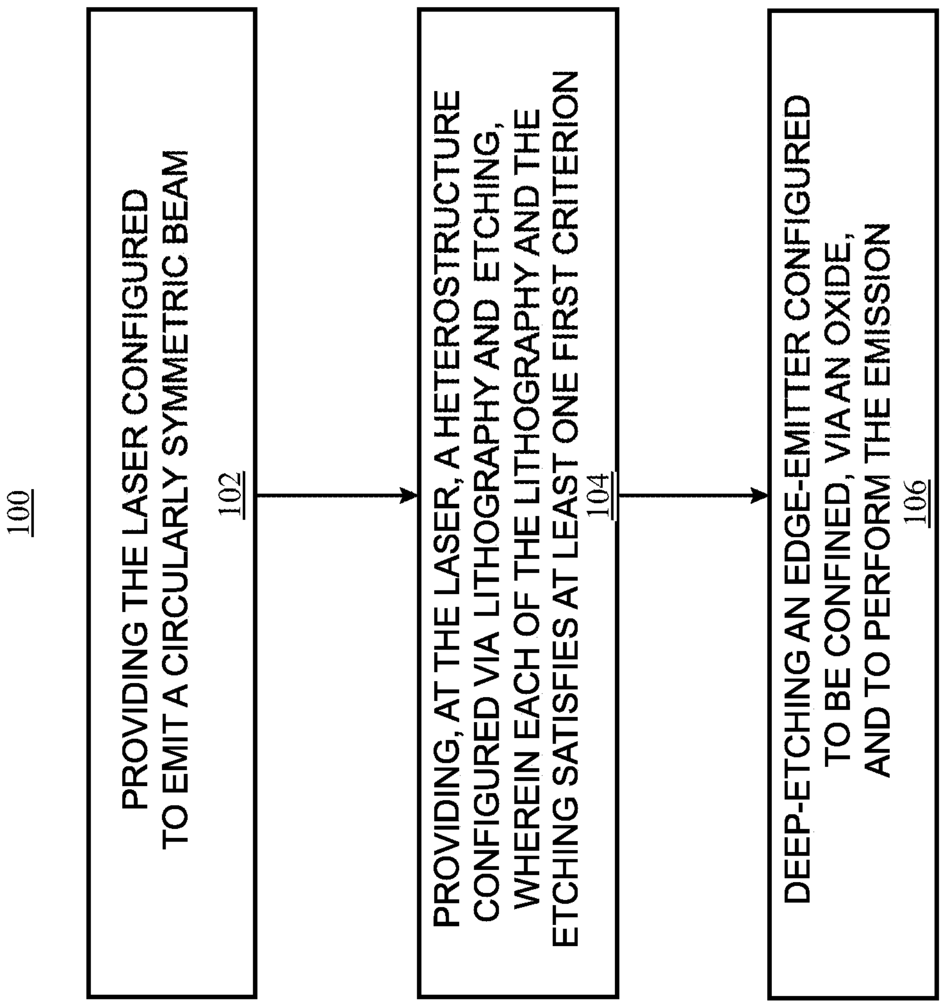
FIG. 34 illustrates a process for manufacturing structure configured to produce a circularly symmetric beam, in accordance with one or more embodiments.

FIG. 34 illustrates method 100 for manufacturing structure configured to produce a circularly symmetric beam via an edge emitting laser (which may be capable of output power greater than 100 mW and be suitable for various free space and focused spot applications), in accordance with one or more embodiments. The operations of method 100 presented below are intended to be illustrative. In some embodiments, method 100 may be accomplished with one or more additional operations not described, and/or without one or more of the operations discussed. Additionally, the order in which the operations of method 100 are illustrated in FIG. 34 and described below is not intended to be limiting.

At operation 102 of method 100, a laser configured to emit a circularly symmetric beam may be provided. At operation 104 of method 100, a heterostructure may be provided at the laser and configured via a lithography and an etching. As an example, each of the lithography and the etching may satisfy at least one first criterion. In some embodiments, HIC RWG structures may achieve a high-efficiency, symmetric output beam laser (e.g., by reducing the lateral dimension of the active stripe to a width comparable to the WG thickness of a LOC laser structure). And, at operation 106 of method 100, an edge-emitter may be deep-etched and configured to be confined, via an oxide.

In some embodiments, operations 102-106 may be performed via one or more of the above-mentioned manufacturing techniques.

Several embodiments of the disclosure have been specifically illustrated and/or described. However, it will be appreciated that modifications and variations are contemplated and within the purview of the appended claims.

What is claimed is:

1. A light amplification by stimulated emission of radiation (laser) configured to emit a circularly symmetric beam, the laser comprising:

a heterostructure configured via a lithography and an etching, the lithography satisfying at least one first lithography criterion and the etching satisfying at least one first etching criterion, wherein the heterostructure comprises a graded index separate confinement heterostructure (GRINSCH), the GRINSCH comprising an asymmetric super large optical cavity (SLOC), the SLOC supporting at least a fundamental mode and two or more higher order modes, the SLOC having a single offset quantum well (QW) that is aligned with a fundamental mode peak; and an edge-emitter configured to (i) have a horizontal waveguide (WG) that is deep-etched through the QW and an optical guiding region, (ii) be confined via an oxide, and (iii) emit a circularly symmetric beam, wherein the beam is made symmetric via the confinement of the horizontal WG on at least one sidewall having a set of dimensions that are not the same as another set of dimensions of a vertical WG built into the heterostructure, wherein only the fundamental mode has an optical confinement factor that is large enough to achieve laser oscillation.

2. The laser of claim 1, wherein the satisfaction of the lithography's at least one first lithography criterion indicates an optimization via a mask being caused to have a predetermined roughness, and wherein the mask defines a ridge for the deep-etching.

3. The laser of claim 2, wherein the ridge has an extent substantially 3.25 μm, and wherein the oxide has a thickness between 0.2 μm and 0.5 μm.

4. The laser of claim 1, wherein the deep-etching extends through a core layer of a wave guide (WG).

5. The laser of claim 1, wherein the satisfaction of the etching's at least one first etching criterion indicates at least one sidewall of the oxide as having a roughness, the roughness satisfying at least one roughness criterion.

6. The laser of claim 1, wherein the heterostructure is further configured to optimize oxidation by including a predetermined ratio of oxygen and water vapor such that the oxide is grown.

7. The laser of claim 1, wherein the horizontal WG comprises a high-index-contrast (HIC) ridge WG (RWG).

8. The laser of claim 1, wherein an emission wavelength is between 0.63 μm and 1.55 μm.

9. The laser of claim 7, wherein the HIC RWG implements a single-spatial-mode.

10. The laser of claim 1, wherein the heterostructure comprises an aluminum gallium arsenide (AlGaAs) lattice.

11. The laser of claim 1, wherein the beam is characterized by a circular mode that is substantially 1.9 μm $1/e^2$, and wherein the beam is further characterized by an angle indicating circular symmetry that is substantially 30 degrees full-width at half-maximum (FWHM).

12. The laser of claim 1, wherein the edge-emitter is integrated in a planar photonic integrated circuit (PIC).

13. The laser of claim 1, wherein the GRINSCH is grown via metalorganic chemical vapor deposition (MOCVD).

14. The laser of claim 11, wherein an output of the laser is stable to at least 165 milliwatts (mW), the stability being achieved via the implementation maintaining a single-spatial-mode, when the laser is driven to a higher output power.

15. The laser of claim 1, wherein the beam is further characterized by a beam quality factor ($M^2$) that is substantially 1.2, and wherein the laser has a substantially low astigmatism, indicating an ability for the beam to be simultaneously focused in a plurality of axes.

16. A method for providing a laser, the method comprising:

providing a heterostructure configured via a lithography and an etching, wherein the lithography satisfies at least one first lithography criterion and the etching satisfies at least one first etching criterion, wherein the heterostructure comprises a graded index separate confinement heterostructure (GRINSCH), the GRINSCH comprising an asymmetric super large optical cavity (SLOC), the SLOC supporting at least a fundamental mode and two or more higher order modes, the SLOC having a single offset quantum well (QW) that is aligned with a fundamental mode peak; and deep-etching an edge-emitter that is configured to have a horizontal waveguide (WG), to be confined via an oxide, and to emit a circularly symmetric beam, the deep-etching extending through the QW and an optical guiding region, wherein the beam is made symmetric via the confinement of the horizontal WG on at least one sidewall having a set of dimensions that are not the same as another set of dimensions of a vertical WG built into the heterostructure, wherein only the fundamental mode has an optical confinement factor that is large enough to achieve laser oscillation.

17. The method of claim 16, wherein the satisfaction of the lithography's at least one first lithography criterion indicates an optimization via a mask being caused to have a predetermined smoothness, and wherein the mask defines a ridge for the deep-etching.

18. The method of claim 16, wherein the beam is characterized by a circular mode that is substantially 1.9 μm $1/e^2$, and wherein the beam is further characterized by an angle indicating circular symmetry that is substantially 30 degrees full-width at half-maximum (FWHM).

19. The method of claim 18, wherein an output of the laser is stable to at least 165 milliwatts (mW), the stability being achieved via the implementation maintaining a single-spatial-mode, when the laser is driven to a higher output power.

* * * * *